United States Patent
Inoue et al.

(10) Patent No.: US 8,736,149 B2
(45) Date of Patent: May 27, 2014

(54) ELECTRONIC COMPONENT WITH METAL PLATE ABOVE ELEMENT AND FABRICATION METHOD OF THE SAME, AND ELECTRONIC DEVICE INCLUDING THE SAME

(71) Applicant: Taiyo Yuden Co., Ltd., Tokyo (JP)

(72) Inventors: Kazunori Inoue, Tokyo (JP); Masafumi Iwaki, Tokyo (JP); Tsutomu Miyashita, Tokyo (JP); Kazuhiro Matsumoto, Tokyo (JP)

(73) Assignee: Taiyo Yuden Co., Ltd., Tokyo (JP)

( * ) Notice: Subject to any disclaimer, the term of this patent is extended or adjusted under 35 U.S.C. 154(b) by 0 days.

(21) Appl. No.: 13/712,227

(22) Filed: Dec. 12, 2012

(65) Prior Publication Data

US 2013/0099628 A1    Apr. 25, 2013

Related U.S. Application Data

(63) Continuation of application No. PCT/JP2011/058924, filed on Apr. 8, 2011.

(30) Foreign Application Priority Data

Sep. 21, 2010   (JP) .................. 2010-211372

(51) Int. Cl.
*H03H 9/25* (2006.01)
*H03H 9/10* (2006.01)
*H03H 3/02* (2006.01)

(52) U.S. Cl.
CPC ............... *H03H 9/1071* (2013.01); *H03H 3/02* (2013.01)
USPC ........ 310/344; 310/313 R; 310/340; 333/193; 333/195

(58) Field of Classification Search
CPC ............ H03H 9/1071; H03H 9/02574; H03H 9/02614; H03H 9/02818; H03H 9/02874; H03H 9/02897
USPC ................... 310/313, 340, 344; 333/193–196
See application file for complete search history.

(56) References Cited

U.S. PATENT DOCUMENTS 7,259,500 B2 *   8/2007   Iwamoto et al. ............... 310/340
8,531,254 B2 *   9/2013   Yamaji et al. .................. 333/193

(Continued)

FOREIGN PATENT DOCUMENTS

JP   2001-217674 A   8/2001
JP   2005-033689 A   2/2005

(Continued)

OTHER PUBLICATIONS

English translation of Written Opinion (PCT/ISA/237) issued in PCT/JP2011/058924 published in Apr. 2013.
International Search Report (ISR) issued in PCT/JP2011/058924 mailed in May 2011.

(Continued)

*Primary Examiner* — Jaydi San Martin
(74) *Attorney, Agent, or Firm* — Chen Yoshimura LLP

(57) ABSTRACT

An electronic component includes: an element that is located on a substrate; a signal wiring that is located on the substrate and electrically connected to the element; a metal plate that is located so as to form a cavity on a functional part of the element and covers an upper surface of the cavity; a support post that is located on the substrate so as not to be located on the signal wiring, and supports the metal plate; and an insulating portion that covers the metal plate and the support post, and contacts a side surface of the cavity.

19 Claims, 21 Drawing Sheets

(56) References Cited

U.S. PATENT DOCUMENTS

| | | | |
|---|---|---|---|
| 2007/0182028 A1 | | 8/2007 | Takano |
| 2012/0223789 A1* | | 9/2012 | Inoue et al. ............... 333/193 |
| 2012/0280768 A1* | | 11/2012 | Nakayama et al. .......... 333/193 |

FOREIGN PATENT DOCUMENTS

| | | | | |
|---|---|---|---|---|
| JP | 2005-175345 | A | | 6/2005 |
| JP | 2007-243916 | A | | 9/2007 |
| JP | 2008-227748 | A | | 9/2008 |
| JP | 2009-218762 | A | | 9/2009 |
| JP | 2010-135959 | A | | 6/2010 |
| JP | 2010157956 | A | * | 7/2010 |

OTHER PUBLICATIONS

Written Opinion (PCT/ISA/237) issued in PCT/JP2011/058924 mailed in May 2011. (Concise Explanation of Relevance: This Written Opinion considers that some of the claims are described by or obvious over the reference No. 3 cited in ISR above.).

Chen et al., "Multilayer Organic Multichip Module Implementing Hybrid Microelectromechanical Systems", IEEE Transactions on Microwave Theory and Techniques, Apr. 2008, vol. 56, No. 4, pp. 952-958.

Kingsley et al., "Moisture Lifetime Testing of RF MEMS Switches Packaged in Liquid Crystal Polymer", IEEE Transactions on Components and Packaging Technologies, Jun. 2008, Vol. 31, No. 2, pp. 345-350.

* cited by examiner

ELECTRONIC COMPONENT WITH METAL PLATE ABOVE ELEMENT AND FABRICATION METHOD OF THE SAME, AND ELECTRONIC DEVICE INCLUDING THE SAME

CROSS-REFERENCE TO RELATED APPLICATION

This application is a continuation application of PCT/JP2011/058924 filed Apr. 8, 2011 claiming the benefit of priority of the prior Japanese Patent Application No. 2010-211372 filed Sep. 21, 2010, the contents of which are herein wholly incorporated by reference.

FIELD

A certain aspect of the present invention relates to an electronic component and a fabrication method of the same, and an electronic device including the same, and particularly, to an electronic component having a cavity on a functional part of an element and a fabrication method of the same, and an electronic device including the same.

BACKGROUND

In recent years, a strong demand for downsizing electronic devices requires electronic components to be downsized. For example, filters and duplexers using acoustic waves are required to be downsized. Exemplary acoustic wave elements using acoustic waves are surface acoustic wave (SAW) elements using surface acoustic waves, film bulk acoustic resonator (FBAR) elements using piezoelectric thin films, and the like.

To meet the demand for downsizing electronic components, wafer level packages, which use a resin instead of a package to seal an element located on a substrate with the resin provided so as to cover the element, have been developed. In addition, when an acoustic wave element is used as an element for example, a cavity located on a functional part of the acoustic wave element is necessary to maintain characteristics of the acoustic wave element, and this may be met by a structure designed to have a resin portion having a cavity on the functional part of the acoustic wave element, which is a so-called hollow structure, for example. The functional part of the acoustic wave element is electrode fingers of a comb-shaped electrode (IDT: Interdigital Transducer) in a surface acoustic wave element, and is a region where upper and lower electrodes, which sandwich a piezoelectric thin film, overlap each other in a piezoelectric thin film resonator element.

The resin portion having the cavity on the functional part of the acoustic wave element may be formed by a method that bonds a resin sheet including a concave portion formed therein, which is to become the cavity, to a substrate including the acoustic wave element formed thereon as disclosed in Japanese Patent Application Publication No. 2005-175345 (Patent Document 1). In addition, there has been known a method that forms a resin portion having the cavity on the functional part of the acoustic wave element, and forms a metal layer in the resin portion located on the upper side of the cavity as disclosed in Japanese Patent Application Publication No. 2008-227748 (Patent Document 2).

Patent Document 1 may fail to obtain the cavity having a sufficient strength because the height is reduced as the size is reduced. On the other hand, the strength of the cavity can be enhanced by providing the metal layer in the resin portion located on the upper side of the cavity as disclosed in Patent Document 2.

However, Patent Document 2 forms the cavity by bonding the resin including a metal layer to a piezoelectric substrate with an acoustic wave element formed thereon, and this may cause misalignment of the metal layer with respect to the acoustic wave element in height and horizontal directions because the resin is soft. When the reduction in height shortens the distance between the acoustic wave element and the metal layer, the misalignment of the metal layer causes a change in capacitance, and may degrade characteristics. In addition, as the resin supporting the metal layer is located on a signal wiring, a capacitor between the signal wiring and the resin may degrade characteristics.

SUMMARY OF THE INVENTION

According to an aspect of the present invention, there is provided an electronic component including: an element that is located on a substrate; a signal wiring that is located on the substrate and electrically connected to the element; a metal plate that is located so as to form a cavity on a functional part of the element and covers an upper surface of the cavity; a support post that is located on the substrate so as not to be located on the signal wiring, and supports the metal plate; and an insulating portion that covers the metal plate and the support post, and contacts a side surface of the cavity.

According to another aspect of the present invention, there is provided an electronic device including: a printed circuit board having the above electronic component mounted thereon.

According to another aspect of the present invention, there is provided a fabrication method of an electronic component including: forming an element on a substrate; forming a signal wiring, which electrically connects to the element, on the substrate; forming a support post on the substrate so that the support post is not located on the signal wiring; forming a metal plate on the support post so that the metal plate forms a cavity on a functional part of the element and covers an upper surface of the cavity; and forming an insulating portion that covers the metal plate and the support post and contacts a side surface of the cavity so as to secure the cavity after the forming the support post and the forming the metal plate.

DETAILED DESCRIPTION

A description will now be given of embodiments of the present invention with reference to the drawings.

First Embodiment

Figure 1A:
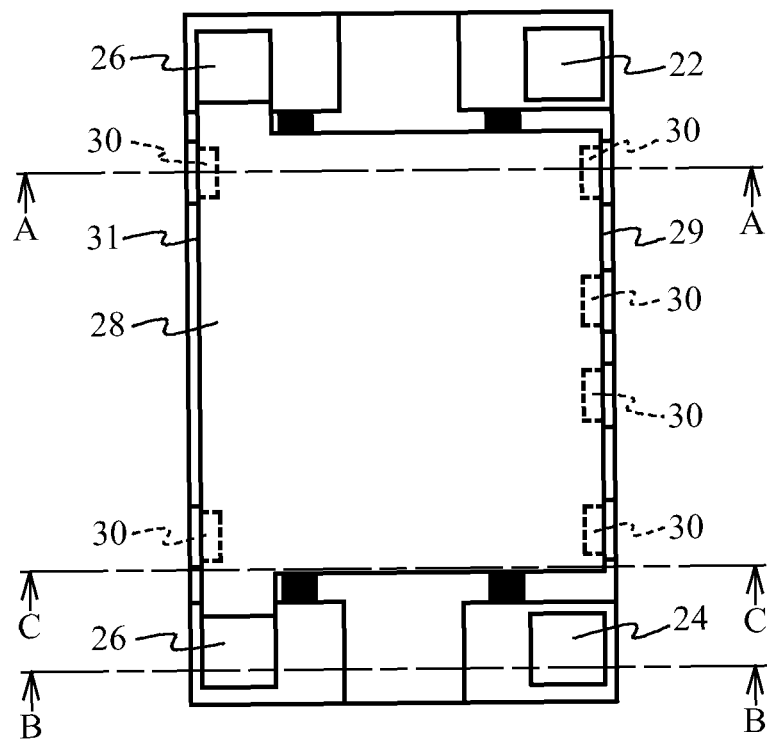
FIG. 1A is a top view of a ladder-type filter in accordance with a first embodiment.
Figure 1B:
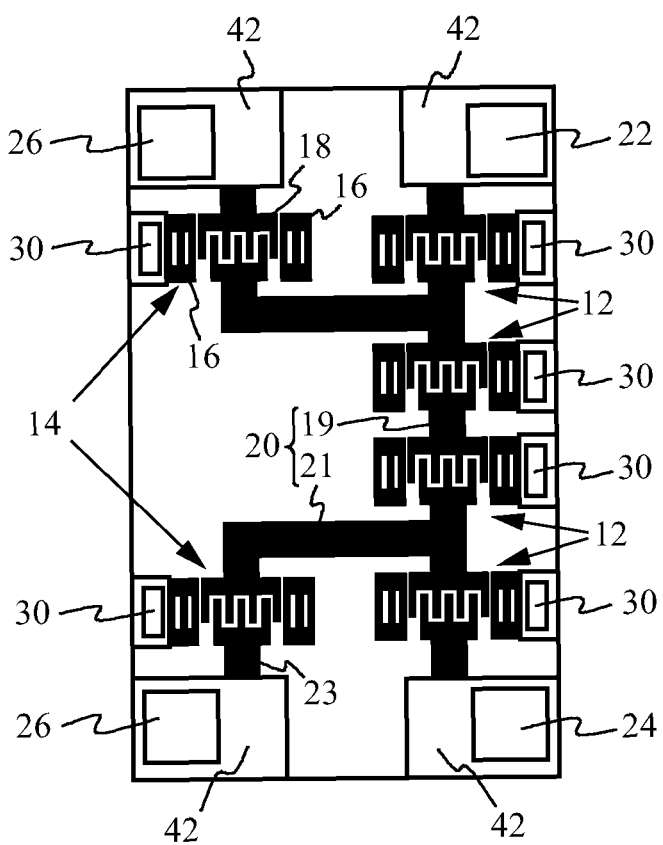
FIG. 1B is a top view illustrating a metal plate in FIG. 1A transparently.

FIG. 1A is a top view of a ladder-type filter in accordance with a first embodiment, and illustrates an insulating portion transparently. FIG. 1B is a top view illustrating a metal plate 28 in FIG. 1A transparently. As illustrated in FIG. 1B, provided are resonators connected in series (hereinafter, referred to as series resonators 12) and resonators connected in parallel to the series resonators 12 (hereinafter, referred to as parallel resonators 14). The series resonators 12 and the parallel resonators 14 are surface acoustic wave elements, each including a pair of reflection electrodes 16 and a comb-shaped electrode (IDT) 18 located therebetween. The comb-shaped electrode 18 includes input-side and output-side electrodes arranged so as to face each other and have electrode fingers alternately arranged.

An input terminal 22 is connected to an input-side electrode of the series resonator 12, which is one of the series resonators 12 at both ends of the series resonators 12 connected in series, through a series wiring 19 and a terminal electrode 42, and an output terminal 24 is connected to an output-side electrode of the series resonator 12, which is the other of the series resonators 12 at both ends, through the series wiring 19 and the terminal electrode 42. The output-side electrode of one series resonator 12 is connected to the input-side electrode of another by the series wiring 19. Input-side electrodes of the parallel resonators 14 are connected to parallel wirings 21 connected to the series wirings 19. Output-side electrodes of the parallel resonators 14 are connected to ground terminals 26 through ground wirings 23 and the terminal electrodes 42. The series wirings 19 and the parallel wirings 21 transmit high-frequency signals input from the input terminal 22. Here, wirings connecting the input terminal to the resonator, one resonator to another resonator, and the resonator to the output terminal are referred to as signal wirings, and the signal wirings transmit high-frequency signals input from the input terminal. Therefore, the series wirings 19 and the parallel wirings 21 are signal wirings 20. The input terminal 22, the output terminal 24, and the ground terminals 26 are connection terminals that provide an external electrical connection to the resonators.

Support posts 30 made of a metal, which support the metal plate 28 to be located above the series resonators 12 and the parallel resonators 14 (see FIG. 1A), are located along opposing sides 29 and 31 of the metal plate 28 in a scattered manner so as to have lengths shorter than lengths of the sides 29 and 31. The support posts 30 are located adjacent to the series resonators 12 and the parallel resonators 14 in propagation directions of acoustic waves that propagate through the series resonators 12 and the parallel resonators 14. That is to say, the support posts 30 are not located on the signal wirings 20, and are located away from the signal wirings 20. The support posts 30 have heights of 10 to 30 μm for example, and accordingly, the metal plate 28 are located 10 to 30 μm above the series resonators 12 and the parallel resonators 14.

As illustrated in FIG. 1A, the metal plate 28 extends to the ground terminals 26, and contacts the ground terminals 26. In addition, the metal plate 28 is also supported by the ground terminals 26. This makes the metal plate 28 electrically connect to the ground terminals 26. The metal plate 28 does not extend to the input terminal 22 or the output terminal 24. That is to say, the metal plate 28 is electrically unconnected to the input terminal 22 and the output terminal 24.

Figure 2A:
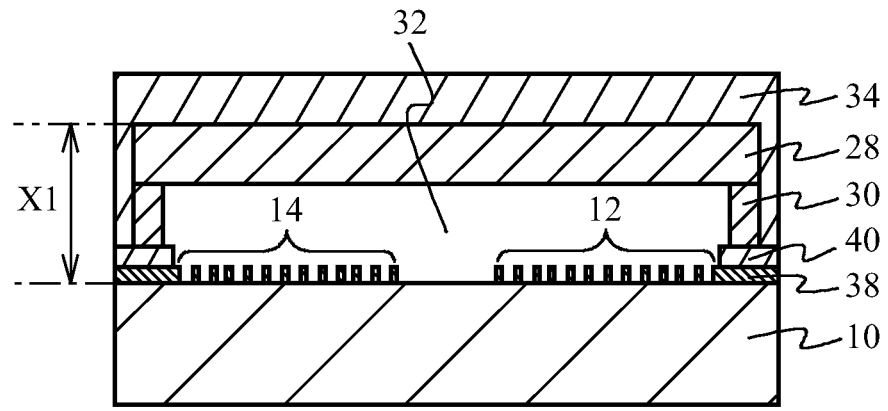
FIG. 2A is a cross-sectional view taken along line A-A in FIG. 1A.
Figure 2B:
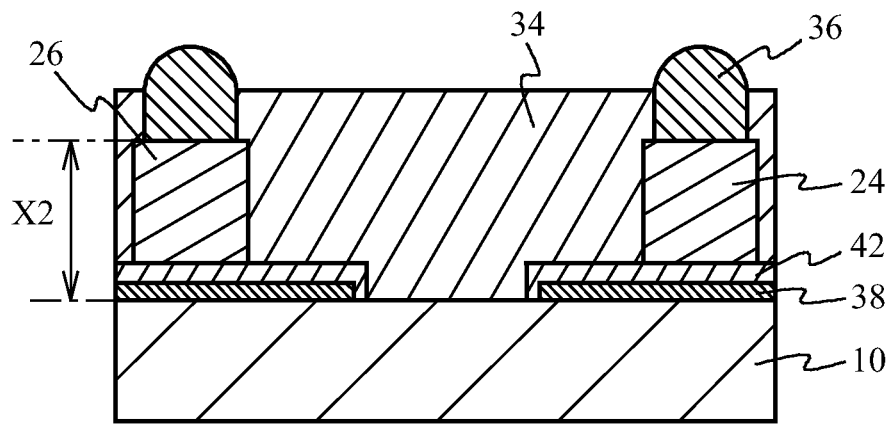
FIG. 2B is a cross-sectional view taken along line B-B in FIG. 1A.
Figure 2C:
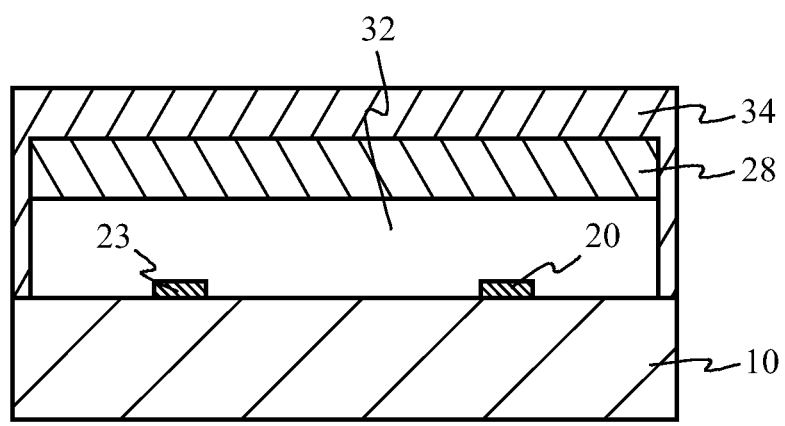
FIG. 2C is a cross-sectional view taken along line C-C in FIG. 1A.

FIG. 2A is a cross-sectional view taken along line A-A in FIG. 1A, FIG. 2B is a cross-sectional view taken along line B-B in FIG. 1A, and FIG. 2C is a cross-sectional view taken along line C-C in FIG. 1A. FIG. 2A through FIG. 2C illustrate an insulating portion 34, which is illustrated transparently in FIG. 1A. As illustrated in FIG. 2A, the series resonators 12 and the parallel resonators 14 are located on a piezoelectric substrate 10. The metal plate 28 is located with being supported by the support posts 30 located on the piezoelectric substrate 10 so that a cavity 32 is formed on electrode fingers of the comb-shaped electrodes 18 of the series resonators 12 and the parallel resonators 14. That is to say, the metal plate 28 is provided so as to form the cavity 32 on the electrode fingers of the comb-shaped electrodes 18 of the series resonators 12 and the parallel resonators 14 and to cover an upper surface of the cavity 32. As illustrated in FIG. 2C, the cavity 32 is formed between the metal plate 28 and the signal wirings 20 because the support posts 30 are not located on the signal wirings 20 and the metal plate 28 is supported by the support posts 30.

As illustrated in FIG. 2A through FIG. 2C, the insulating portion 34 is provided on the piezoelectric substrate 10 to cover and seal the metal plate 28 and the support posts 30. The insulating portion 34 is formed of a resin film for example. In addition, the insulating portion 34 is provided so as to contact and cover a part of a side surface of the cavity 32 located on the electrode fingers of the comb-shaped electrodes 18. The input terminal 22, the output terminal 24, and the ground terminals 26 are located so as to penetrate through the insulating portion 34, and solder balls 36 are located on upper surfaces of the input terminal 22, the output terminal 24, and the ground terminals 26. The solder balls 36 protrude from the upper surface of the insulating portion 34. This enables to provide an external electrical connection to the series resonators 12 and the parallel resonators 14.

As illustrated in FIG. 2A, electrical supply wirings 38 and underlayer electrodes 40 are located between the support posts 30 and the piezoelectric substrate 10. As illustrated in FIG. 2B, the electrical supply wirings 38 and the terminal electrodes 42 are located between the input terminal 22, the output terminal 24, and the ground terminals 26 and the piezoelectric substrate 10. As illustrated in FIG. 2A and FIG. 2B, a height X1 from an upper surface of the piezoelectric substrate 10 to an upper surface of the metal plate 28 is approximately equal to a height X2 from the upper surface of the piezoelectric substrate 10 to the upper surfaces of the input terminal 22, the output terminal 24, and the ground terminals 26.

A description will now be given of a fabrication method of the ladder-type filter in accordance with the first embodiment with reference to FIG. 3A through FIG. 9C. The fabrication method of the ladder-type filter of the first embodiment is a fabrication method using multiple structures, and can improve efficiency in mass production, and reduce production cost per unit price of a chip.

Figure 3A:
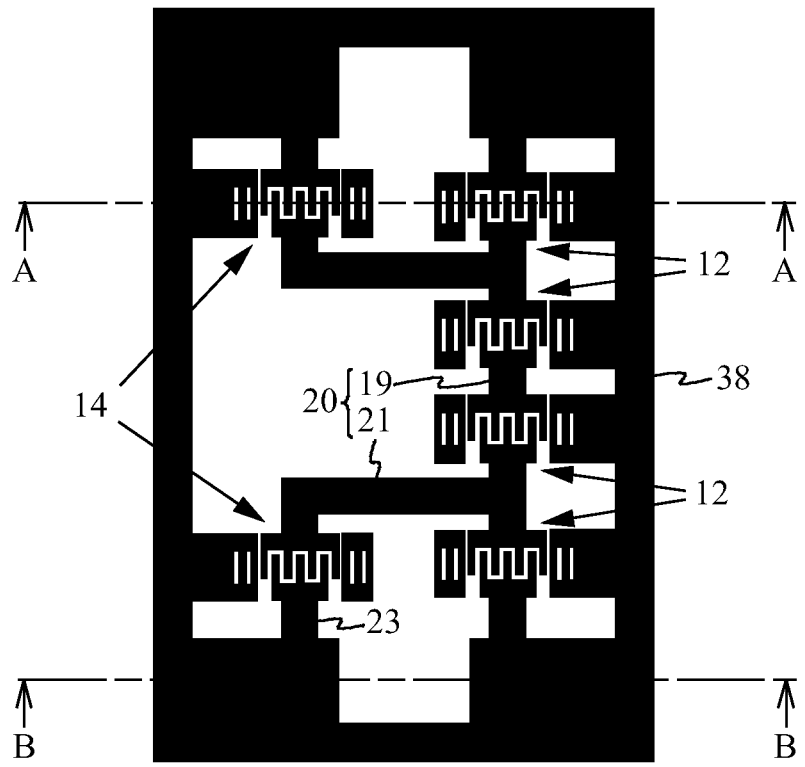
FIG. 3A is a top view (No. 1) illustrating a fabrication method of the ladder-type filter in accordance with the first embodiment.
Figure 3B:
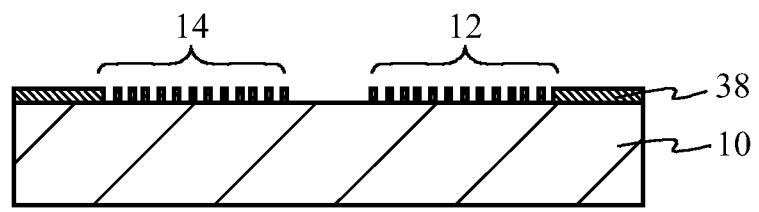
FIG. 3B is a cross-sectional view taken along line A-A in FIG. 3A.
Figure 3C:
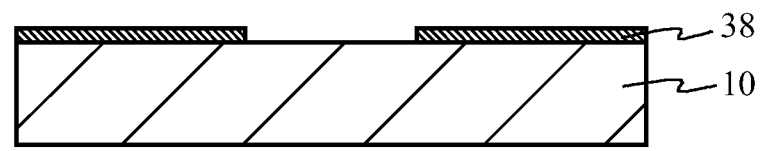
FIG. 3C is a cross-sectional view taken along line B-B in FIG. 3A.

As illustrated in FIG. 3A through FIG. 3C, on the upper surface of the piezoelectric substrate 10 that is, for example, $LiTaO_3$ (LT) in a wafer state, formed are the series resonators 12, the parallel resonators 14, the signal wirings 20, the ground wirings 23, and the electrical supply wirings 38 for plating, which are formed of a pattern of metal such as aluminum (Al). Al is formed by evaporation or sputtering for example, and then dry etched into desired shapes to form the series resonators 12, the parallel resonators 14, the signal wirings 20, the ground wirings 23, and the electrical supply wirings 38. Liftoff may be used.

Figure 4A:
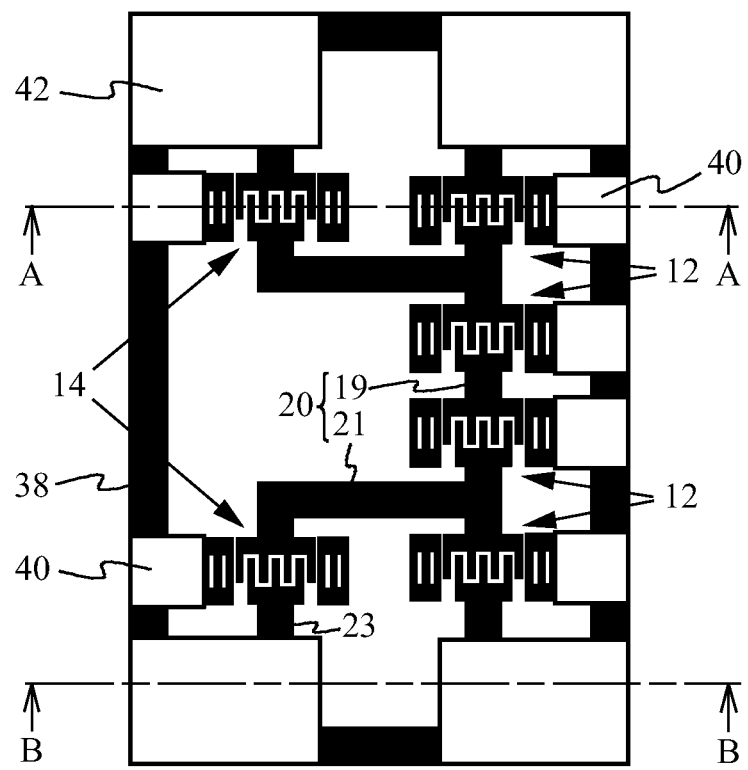
FIG. 4A is a top view (No. 2) illustrating the fabrication method of the ladder-type filter in accordance with the first embodiment.
Figure 4B:
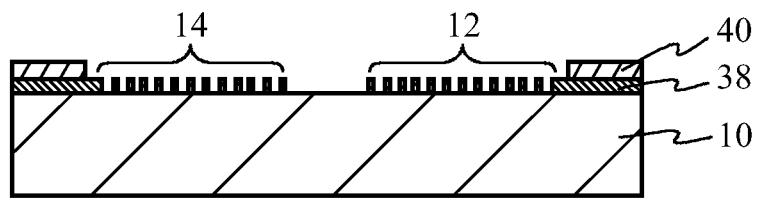
FIG. 4B is a cross-sectional view taken along line A-A in FIG. 4A.
Figure 4C:
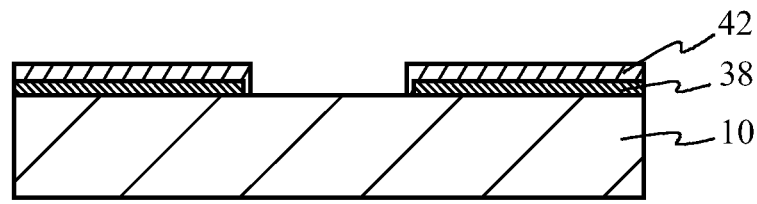
FIG. 4C is a cross-sectional view taken along line B-B in FIG. 4A.

As illustrated in FIG. 4A through FIG. 4C, the underlayer electrodes 40 are formed in regions where the support posts 30 are to be formed, and the terminal electrodes 42 are formed in regions where the input terminal 22, the output terminal 24, and the ground terminals 26 are to be formed. The underlayer electrodes 40 and the terminal electrodes 42 are made of a metal such as Cu (copper) for example. The underlayer electrodes 40 and the terminal electrodes 42 can be formed by evaporation and liftoff, for example.

Figure 5A:
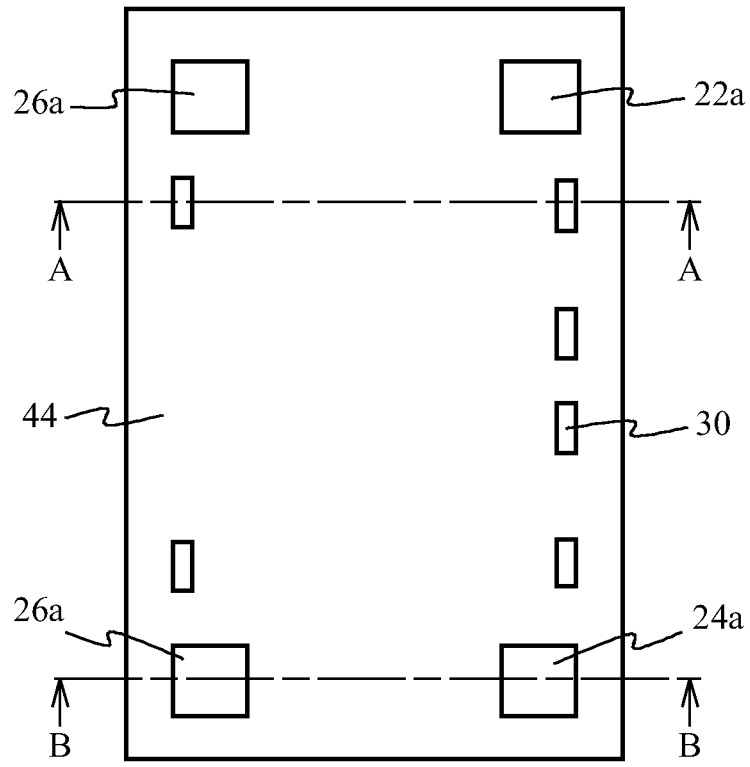
FIG. 5A is a top view (No. 3) illustrating the fabrication method of the ladder-type filter in accordance with the first embodiment.
Figure 5B:
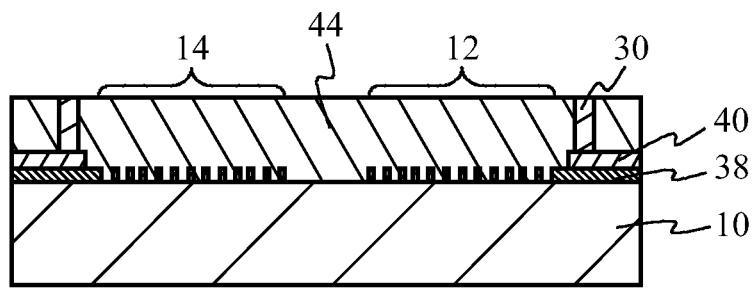
FIG. 5B is a cross-sectional view taken along line A-A in FIG. 5A.
Figure 5C:
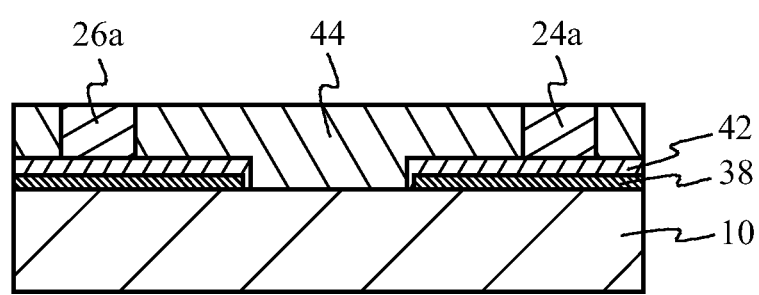
FIG. 5C is a cross-sectional view taken along line B-B in FIG. 5A.

As illustrated in FIG. 5A through FIG. 5C, a plating resist 44 having, for example, negative-type photosensitivity is applied on the piezoelectric substrate 10, and patterned to form openings corresponding to the regions where the support posts 30, the input terminal 22, the output terminal 24, and the ground terminals 26 are to be formed. The plating resist 44 has a thickness of 10 to 30 μm for example. Then, a metal film such as a Cu film is formed so as to be embedded in the openings of the plating resist 44 by electrolytic plating for example. This process forms the support posts 30, and an input terminal 22a, an output terminal 24a, and ground terminals 26a that are portions of the input terminal 22, the output terminal 24, and the ground terminals 26 respectively. The support posts 30 are formed along the opposing sides of the metal plate 28 in a scattered manner so as to have lengths shorter than the lengths of the sides and not to be located on the signal wirings 20.

Figure 6A:
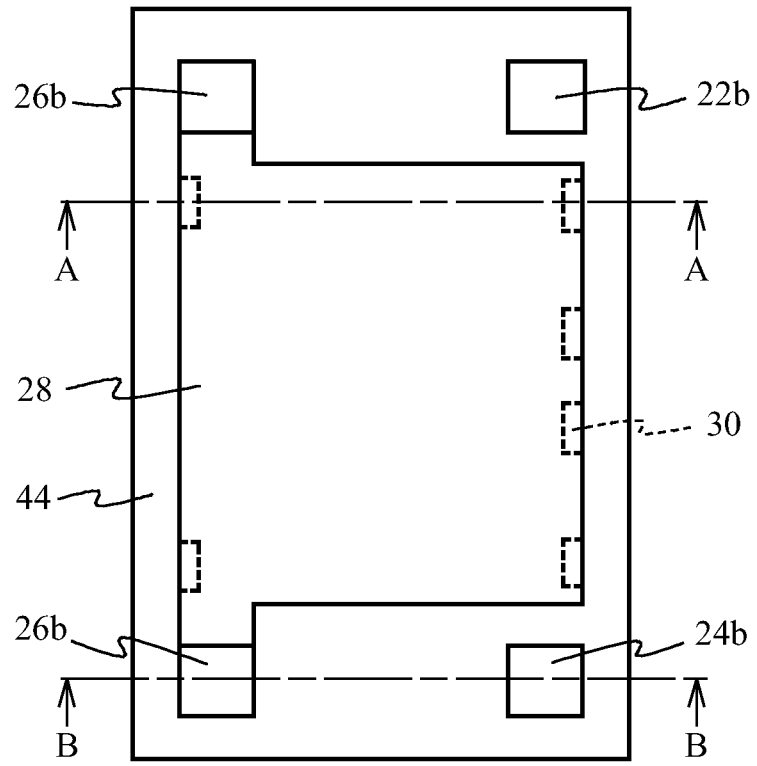
FIG. 6A is a top view (No. 4) illustrating the fabrication method of the ladder-type filter in accordance with the first embodiment.
Figure 6B:
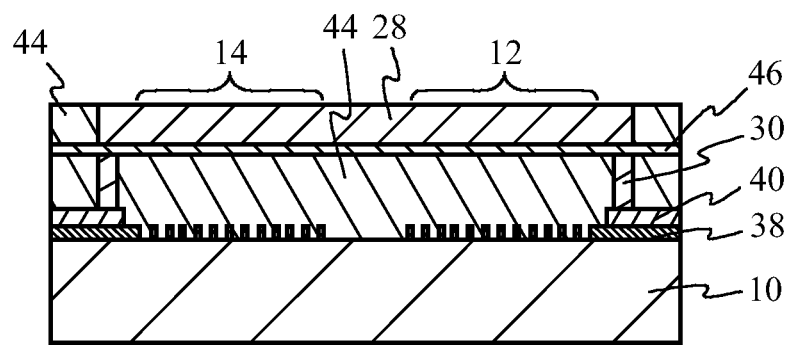
FIG. 6B is a cross-sectional view taken along line A-A in FIG. 6A.
Figure 6C:
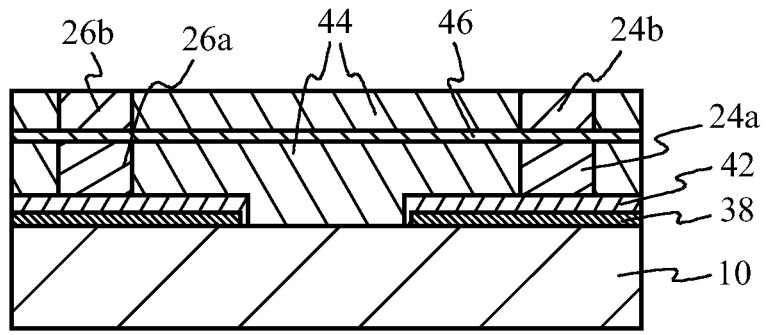
FIG. 6C is a cross-sectional view taken along line B-B in FIG. 6A.

As illustrated in FIG. 6A through FIG. 6C, a seed metal 46 for metal plating such as Cu plating is formed on the entire surface by evaporation or sputtering for example. The seed metal 46 has a thickness of about 100 nm for example. Then, the plating resist 44 with a thickness of, for example, 5 to 30 μm is applied, and patterned to form openings corresponding to the regions where the metal plate 28, the input terminal 22, the output terminal 24, and the ground terminals 26 are to be formed. A metal film such as a Cu film is then formed by, for example, electrolytic plating so as to be embedded in the openings of the plating resist 44 to form the metal plate 28, and the input terminal 22b, output terminal 24b, and the ground terminals 26b that are portions of the input terminal 22, the output terminal 24, and the ground terminals 26 respectively.

Figure 7A:
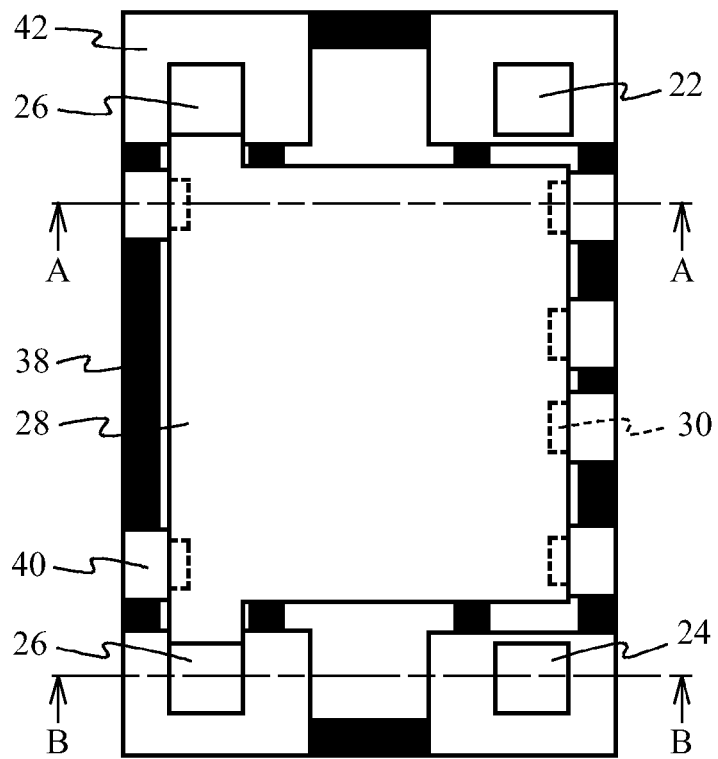
FIG. 7A is a top view (No. 5) illustrating the fabrication method of the ladder-type filter in accordance with the first embodiment.
Figure 7B:
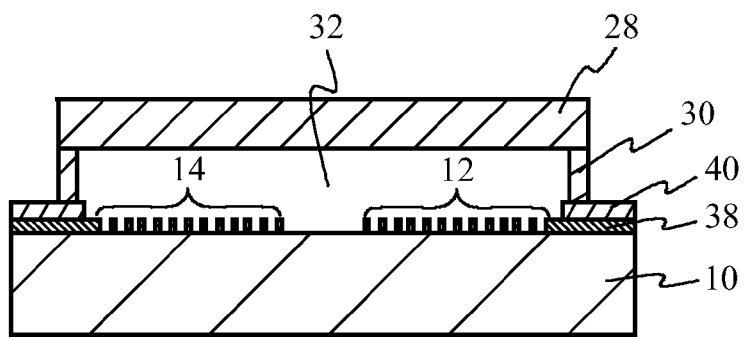
FIG. 7B is a cross-sectional view taken along line A-A in FIG. 7A.
Figure 7C:
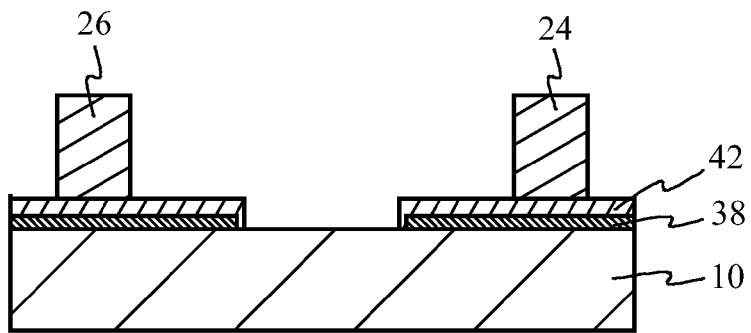
FIG. 7C is a cross-sectional view taken along line B-B in FIG. 7A.

As illustrated in FIG. 7A through FIG. 7C, the plating resist 44 is removed by, for example, ultrasonic cleaning with a resist removing solution, or combination of ultrasonic cleaning and oxygen plasma ashing. As the metal plate 28 is supported by the support posts 30, the resist removing solution or the like penetrates between the piezoelectric substrate 10 and the metal plate 28, and removes the plating resist 44 between the piezoelectric substrate 10 and the metal plate 28. This process forms the cavity 32 on the electrode fingers of the comb-shaped electrodes of the series resonators 12 and the parallel resonators 14. In addition, the seed metal 46 sandwiched by the plating resist 44 has a thin film thickness, and is thus removed at the same time as the plating resist 44 is removed. The input terminal 22 is composed of the input terminals 22a and 22b and the seed metal 46 therebetween. The output terminal 24 is composed of the output terminals 24a and 24b and the seed metal 46 therebetween, and the ground terminals 26 are composed of the ground terminals 26a and 26b and the seed metal 46 therebetween. In addition, the metal plate 28 includes the seed metal 46 under the metal plate 28.

Figure 8A:
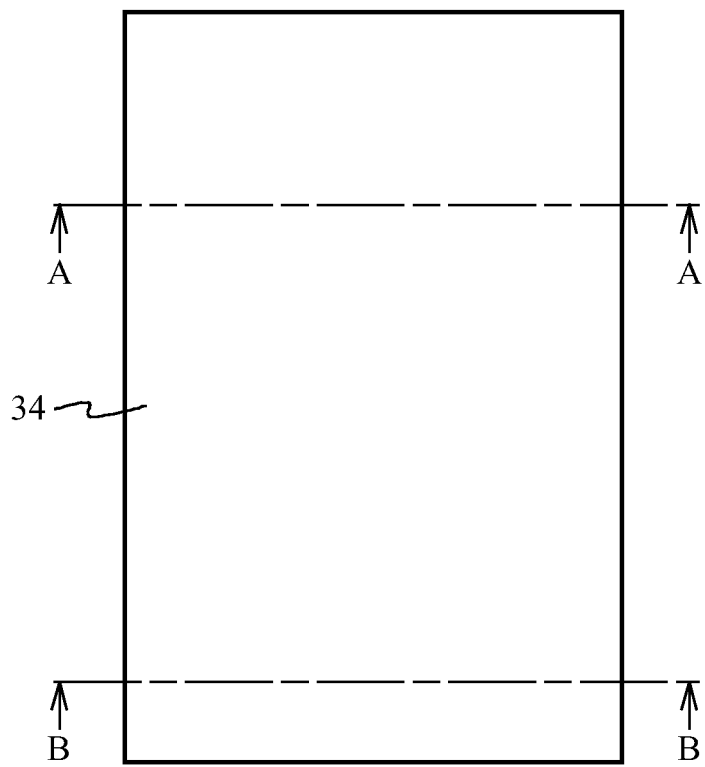
FIG. 8A is a top view (No. 6) illustrating the fabrication method of the ladder-type filter in accordance with the first embodiment.
Figure 8B:
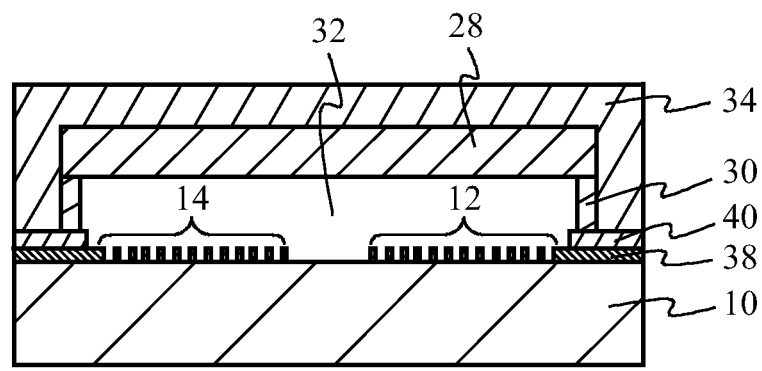
FIG. 8B is a cross-sectional view taken along line A-A in FIG. 8A.
Figure 8C:
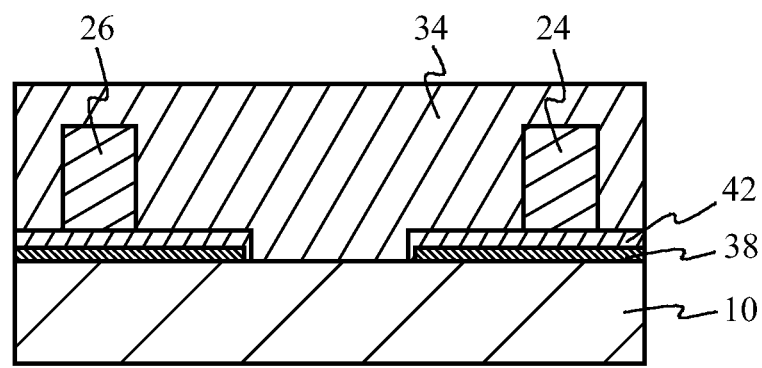
FIG. 8C is a cross-sectional view taken along line B-B in FIG. 8A.

As illustrated in FIG. 8A through FIG. 8C, a resin sheet made of, for example, a thermoplastic liquid crystal polymer sheet is thermocompressed on the piezoelectric substrate 10 so as to cover the metal plate 28, the support posts 30, the input terminal 22, the output terminal 24, and the ground terminals 26 to form the insulating portion 34 made of a resin film covering the metal plate 28, the support posts 30, the input terminal 22, the output terminal 24, and the ground terminals 26. The thermocompression of the resin sheet on the piezoelectric substrate 10 suppresses the flow of the resin into the cavity 32 between the metal plate 28 and the series resonators 12 and parallel resonators 14, and secures the cavity 32. This allows the insulating portion 34 made of a resin film to contact the side surface of the cavity 32. The resin sheet is not limited to a thermoplastic resin sheet, may be a thermosetting resin sheet, and is preferably a resin sheet having a low hygroscopic property and a high adhesiveness. In addition, the resin sheet may be photosensitive.

Figure 9A:
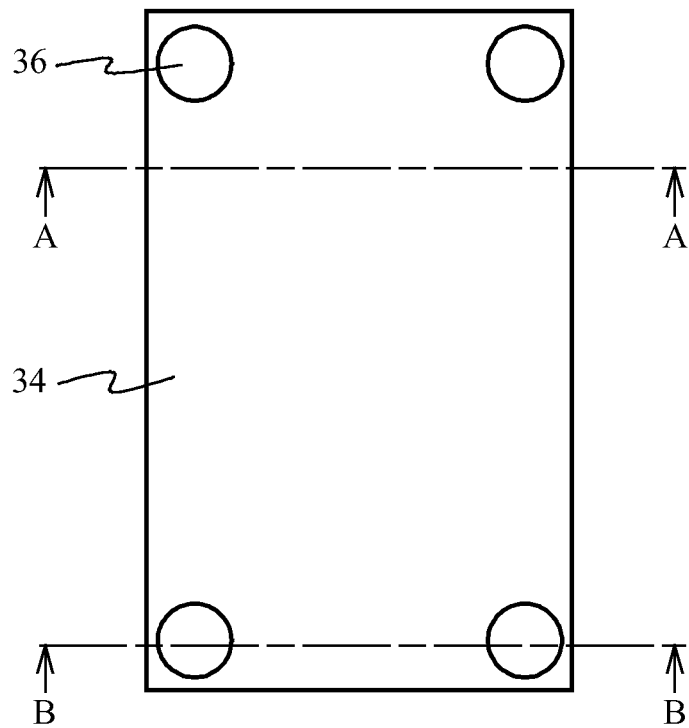
FIG. 9A is a top view (No. 7) illustrating the fabrication method of the ladder-type filter in accordance with the first embodiment.
Figure 9B:
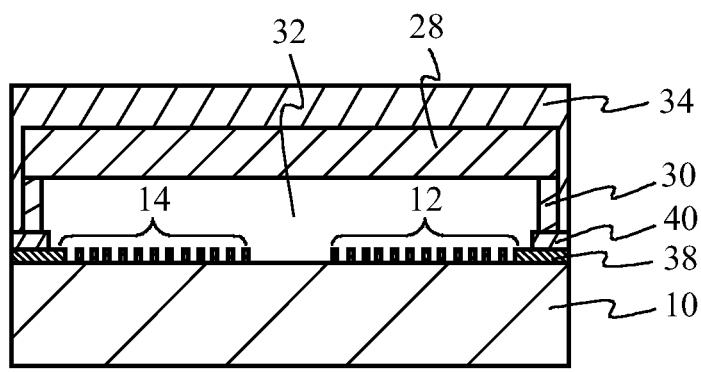
FIG. 9B is a cross-sectional view taken along line A-A in FIG. 9A.
Figure 9C:
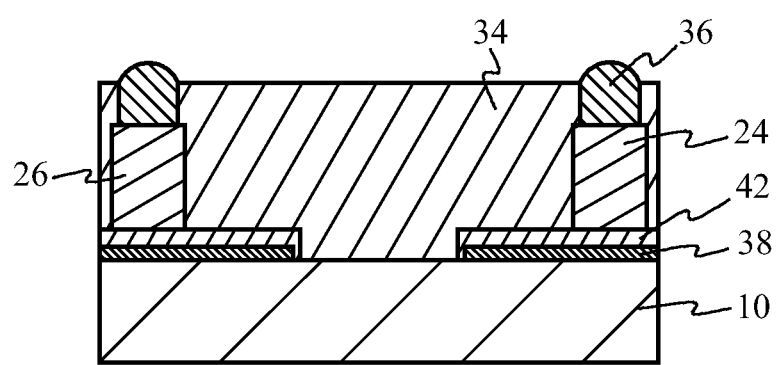
FIG. 9C is a cross-sectional view taken along line B-B in FIG. 9A.

As illustrated in FIG. 9A through FIG. 9C, the insulating portion 34 on the input terminal 22, the output terminal 24, and the ground terminals 26 are removed by laser drilling for example, and residues of resin are then removed by desmear treatment for example. When the resin film constituting the insulating portion 34 is photosensitive, the resin on the terminals may be removed by exposure and development. In this case, the desmear treatment is unnecessary. The solder balls 36 are formed in the regions removed by laser drilling or the like by solder paste printing and reflow, for example. Or, the solder balls 36 may be formed by filling solder in the regions removed by laser drilling or the like by SnAg plating with reusing the electrical supply wirings 38, and then reflowing the solder. Furthermore, the solder balls 36 may be formed by printing flux and mounting and reflowing solder balls. Then, the wafer is separated into individual filters or chips by dicing. Unnecessary parts of the electrical supply wirings 38 are removed by separating the wafer into individual filters. The above process completes the ladder-type filter of the first embodiment.

As described above, the first embodiment forms the support posts 30 on the piezoelectric substrate 10, and then forms the metal plate 28, which forms the cavity 32 on the electrode fingers of the comb-shaped electrodes 18 of the series resonators 12 and the parallel resonators 14 and covers the upper surface of the cavity 32, on the support posts 30 as described in FIG. 5A through FIG. 6C. As described in FIG. 8A through FIG. 8C, after forming the support posts 30 and the metal plate 28, the first embodiment forms the insulating portion 34 that is made of a resin film, covers the metal plate 28 and the support posts 30, and contacts the side surface of the cavity 32 so as to secure the cavity 32. This forms the cavity 32 on the electrode fingers of the comb-shaped electrodes 18 of the series resonators 12 and the parallel resonators 14 formed on the piezoelectric substrate 10 as illustrated in FIG. 2A. The upper surface of the cavity 32 is in contact with and covered with the metal plate 28 supported by the support posts 30, and the side surface of the cavity 32 is in contact with and covered with the insulating portion 34 made of a resin film.

As described previously, when the resin having a metal layer is bonded on the piezoelectric substrate with the surface acoustic wave element formed thereon, the misalignment of the metal with respect to the surface acoustic wave element may occur in height and horizontal directions because the resin is soft. However, forming the metal plate 28 on the support posts 30 enables to control a position at which the metal plate 28 is to be formed precisely, and suppress the misalignment of the metal plate 28 as described in the first embodiment. For example, the misalignment of the metal plate 28 can be suppressed by forming the support posts 30 made of a metal and the metal plate 28 thereon by plating. This enables to further suppress degradation of characteristics of the ladder-type filter. In addition, the strength of the cavity 32 can be enhanced by forming the cavity 32 with the metal plate 28, and accordingly, the height of the ladder-type filter can be reduced.

The support posts 30 may be made of an insulating material instead of a metal. In addition, when the metal plate is formed on support posts made of a resin, the misalignment of the metal plate with respect to the resonator may occur in height and horizontal directions because the resin is soft. Therefore, the support posts 30 are preferably made of a material other than a resin. The support posts 30 are preferably formed of a material harder than a resin in order to suppress the misalignment of the metal plate 28.

The support posts 30 are formed so as not to be located on the signal wirings 20 as illustrated in FIG. 2C. For example, it may be considered to form the support post 30 that completely surrounds the series resonators 12 and the parallel resonators 14 to support the metal plate 28. In this case, as the support post 30 is also formed on the signal wiring 20, filter characteristics may be degraded by the capacitor between the support post 30 and the signal wiring 20. Not only when the support post 30 is made of a metal but also when it is formed of an insulating material, the support post 30 formed on the signal wiring 20 may generate the capacitor between the support post 30 and the signal wiring 20 because of permittivity, and may degrade filter characteristics. Therefore, as described in the first embodiment, the capacitance between the signal wirings 20 and the support posts 30 can be reduced, and the degradation of filter characteristics can be suppressed by not providing the support posts 30 on the signal wirings 20.

Although the support posts 30 are preferably not formed on any signal wirings 20 to suppress degradation of filter characteristics, the support posts 30 may be formed on a part of the signal wirings 20. In this case, the support post 30 is preferably not formed on the signal wiring 20 that has a large effect on filter characteristics, and the support post 30 is preferably formed on the signal wiring 20 that has a small effect on filter characteristics. For example, the support post 30 may not be located on the series wiring 19, and the support post 30 may be located on the parallel wiring 21.

As illustrated in FIG. 2A and FIG. 2C, the metal plate 28 is located away from the series resonators 12, the parallel resonators 14, and the signal wirings 20 by a height of the support post 30 (a height of the cavity 32). When the metal plate 28 is not connected to a ground, or is connected to a ground insufficiently, the capacitances between the metal plate 28 and the series resonators 12, the parallel resonators 14, and the signal wirings 20 become larger as the metal plate 28 comes closer to the series resonators 12, the parallel resonators 14, and the signal wirings 20, and affect the characteristics of the ladder-type filter. A film thickness of the electrode finger affects a frequency to be used, and the film thickness of the electrode finger becomes smaller as the frequency becomes higher. The proper height of the support post 30 (the height of the cavity 32) depends on the frequency to be used. Therefore, the height of the support post 30 (the height of the cavity 32) is preferably more than or equal to 50 times, and more preferably more than or equal to 75 times greater than the film thickness of the electrode finger in view of characteristics of the ladder-type filter. For example, the support post 30 is located 10 μm or more than 10 μm away, and more preferably 15 μm or more than 15 μm away. In addition, when the support post 30 is tall, the resin may flow into the cavity 32 when the insulating portion 34 is formed. Therefore, the height of the support post 30 is preferably less than or equal to a height capable of preventing the inflowing resin from contacting the resonators formed in the cavity 32 when the insulating portion 34 made of a resin film is formed. For example, the height of the support post 30 (the height of the cavity 32) is preferably less than or equal to 150 times, and more preferably less than or equal to 100 times greater than the film thickness of the electrode finger.

On the other hand, when the metal plate 28 is reliably connected to a ground and reliably has a ground potential, good filter characteristics can be obtained even when the height of the support post 30 (the height of the cavity 32) is 5 times greater than the film thickness of the electrode finger. That is to say, the height of the support post 30 (the height of the cavity 32) may be more than or equal to 5 times, and more preferably more than or equal to 7.5 times greater than the film thickness of the electrode finger, and can be greater than or equal to 1 μm, for example, and more preferably greater than or equal to 1.5 μm.

To make the metal plate 28 have a ground potential, the metal plate 28 is preferably electrically connected to the ground terminals 26. For example, as illustrated in FIG. 1A, the metal plate 28 is preferably formed so as to extend to the ground terminals 26 and contact the ground terminals 26 to have a ground potential. In this case, the support posts 30, whether formed of a metal or an insulating material, enable the metal plate 28 to have a ground potential. In addition, when the metal plate 28 can not be formed so as to extend to the ground terminals 26, the metal plate 28 may be connected to the ground through other routes. For example, when the support posts 30 are made of a metal, the metal plate 28 may be made to have a ground potential by locating the support posts 30 on the ground wirings 23. The effect to shield the series resonators 12 and the parallel resonators 14 covered with the metal plate 28 can also be obtained by making the metal plate 28 have a ground potential as described above.

As described in FIG. 8A through FIG. 8C, the resin sheet made of a thermoplastic liquid crystal polymer sheet is bonded to the piezoelectric substrate 10 so as to cover the metal plate 28 and the support posts 30 and contact the side surface of the cavity 32 to form the insulating portion 34 made of a resin film covering and sealing the metal plate 28 and the support posts 30. Since the viscosity of the resin sheet made of a liquid crystal polymer sheet is high to some extent, the flow into the cavity 32 is suppressed, and thus the insulating portion 34 contacting the side surface of the cavity 32 is formed to secure the cavity 32. Accordingly, to form the insulating portion 34, the resin sheet may be bonded to the piezoelectric substrate 10, or a liquid resin, which has a viscosity high enough to prevent the liquid resin from contacting the resonators in the cavity 32, may be applied so as to cover the metal plate 28 and the support posts 30. In addition, a liquid resin to which filler or the like is added may be used. The filler preferably has a diameter larger than the height of the cavity 32 for example. In the above cases, the resin only flows into the cavity 32 to the extent that the resin does not contact the resonators in the cavity 32, and accordingly, the insulating portion 34 contacting the side surface of the cavity 32 can be formed so as to secure the cavity 32.

As described in FIG. 5A through FIG. 5C, the support posts 30 are formed along the opposing sides 29 and 31 of the metal plate 28 in a scattered manner by plating so as to have lengths shorter than the lengths of the sides 29 and 31. Such support posts 30 allow a resist removing solution to penetrate between the metal plate 28 and the piezoelectric substrate 10 when the plating resist 44 is removed as described in FIG. 7A through FIG. 7C, and enable to remove the plating resist 44 between the metal plate 28 and the piezoelectric substrate 10 easily. Therefore, the length of the support post 30 is preferably shorter than half of, and more preferably quarter of the lengths of the opposing sides 29 and 31 of the metal plate 28. In addition, the metal plate 28 can be supported stably by locating the support posts 30 along the opposing sides 29 and 31 of the metal plate 28.

As described in FIG. 5A through FIG. 6C, the formation of the support posts 30 and the metal plate 28 located thereon and the formation of the connection terminals of the input terminal 22, the output terminal 24, and the ground terminals 26 are performed simultaneously. Therefore, as illustrated in FIG. 2A and FIG. 2B, the height X1 from the upper surface of the piezoelectric substrate 10 to the upper surface of the metal plate 28 becomes approximately equal to the height X2 from the upper surface of the piezoelectric substrate 10 to the upper surfaces of the input terminal 22, the output terminal 24, and the ground terminals 26. As described above, the fabrication process can be simplified by performing the formation of the support post 30 and the metal plate 28 located thereon, and the formation of the connection terminals of the input terminal 22, the output terminal 24, and the ground terminals 26 simultaneously.

Figure 10A:
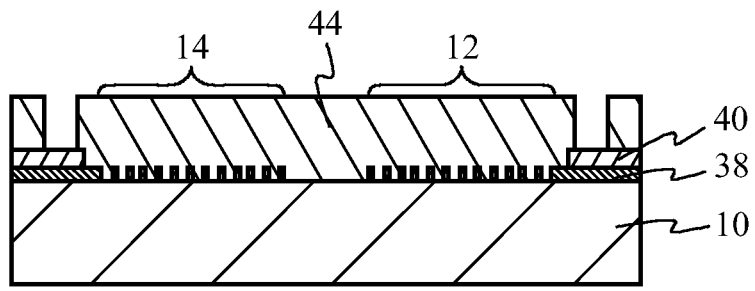
FIG. 10A through FIG. 10D are cross-sectional views illustrating a fabrication method that forms a metal post and a metal plate by plating simultaneously.
Figure 10B:
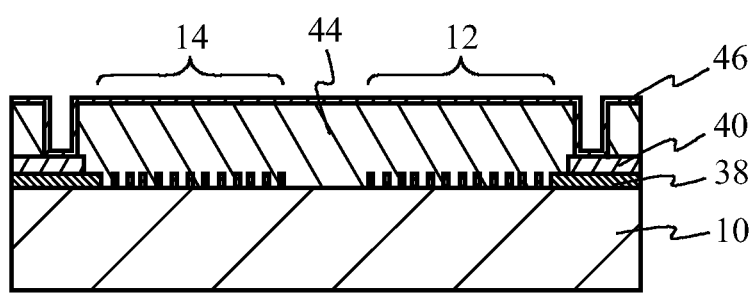
Figure 10C:
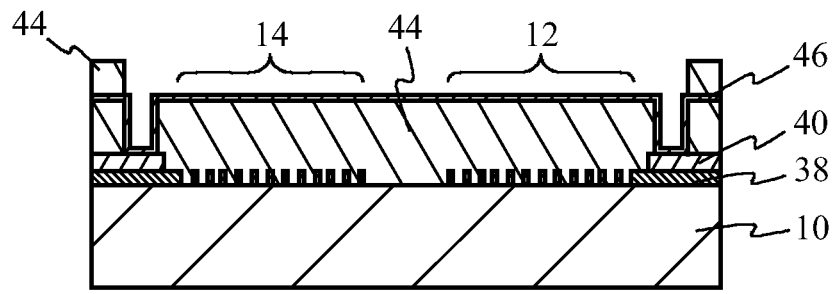
Figure 10D:
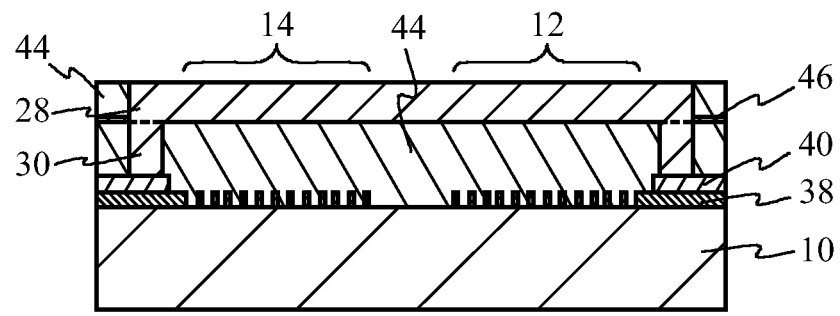

As described in FIG. 5A through FIG. 6C, the first embodiment performs plating to form the support posts 30 and plating to form the metal plate 28 separately, but the support posts 30 and the metal plate 28 may be formed by plating simultaneously. FIG. 10A through FIG. 10D illustrate how the support posts 30 and the metal plate 28 are formed by plating simultaneously. As illustrated in FIG. 10A, the plating resist 44 having openings corresponding to regions where the support posts 30 are to be formed is formed on the piezoelectric substrate 10. As illustrated in FIG. 10B, the seed metal 46 for Cu plating is formed on the entire surface. As illustrated in FIG. 10C, the plating resist 44 having an opening corresponding to a region where the metal plate 28 is to be formed is formed on the seed metal 46. As illustrated in FIG. 10D, a Cu film is embedded in the openings of the plating resist 44 by electrolytic plating for example to form the support posts 30 and the metal plate 28 simultaneously.

Coils, capacitors, or passive elements such as transmission lines connecting to the ladder-type filter may be formed with a same metal as the support posts 30 and the metal plate 28 at the same time as the support posts 30 and the metal plate 28 are formed.

FIG. 1A illustrates the metal plate 28 formed so as to cover the series resonators 12 and the parallel resonators 14 all together, but does not intend any limitation. The metal plates 28 that separately cover the respective series resonators 12 and parallel resonators 14 may be formed.

In addition, the piezoelectric substrate 10 may be made of $LiNbO_3$ (LN), ZnO, $KNbO_3$, or LBO besides LT. In addition, the comb-shaped electrode 18 and the reflection electrodes 16 may be formed with Au, Ag, W, Cu, Ta, Pt, Mo, Ni, Co, Cr, Fe, Mn, or Ti besides Al.

The first embodiment is the exemplary ladder-type filter having the series resonators 12 and the parallel resonators 14, which are surface acoustic wave elements, formed on the piezoelectric substrate 10, but may be multimode type filters, dual filters, or duplexers. In addition, the elements are not limited to the surface acoustic wave elements, and may be piezoelectric thin film resonator elements or the like. Furthermore, even when an electronic component does not use acoustic waves, the first embodiment is applicable as long as the electronic component has the cavity on the functional part of the element formed on the substrate. In this case, the signal wirings correspond to a wiring interconnecting elements formed on a substrate, a wiring connecting the element to the input terminal, a wiring connecting the element to an output terminal, and the like, and transmit electrical signals.

Second Embodiment

Figure 11A:
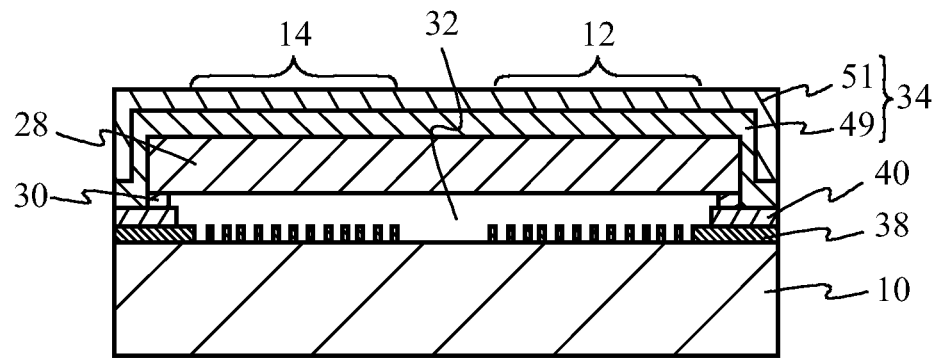
FIG. 11A through FIG. 11C are cross-sectional views of a ladder-type filter in accordance with a second embodiment.
Figure 11B:
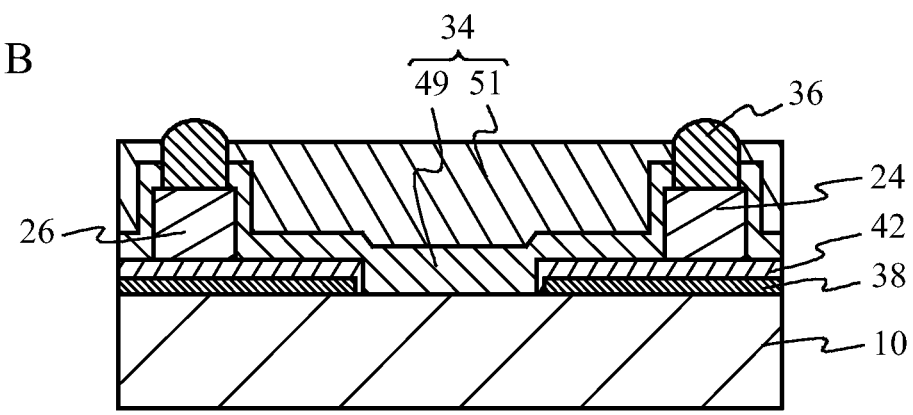
Figure 11C:
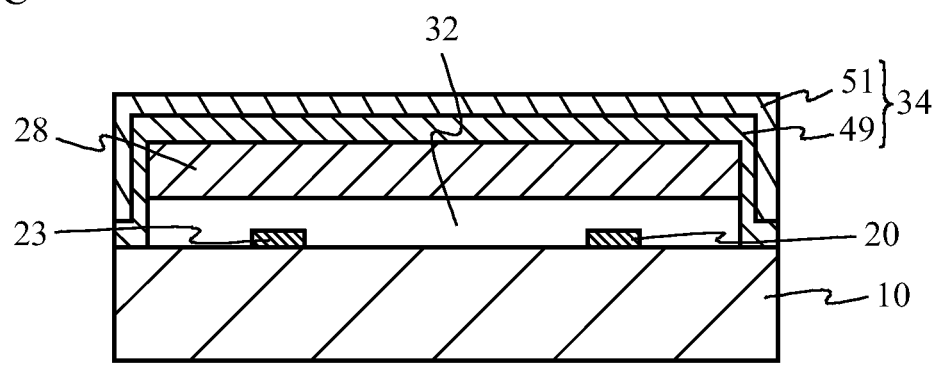

FIG. 11A through FIG. 11C are cross-sectional views of a ladder-type filter in accordance with a second embodiment, and correspond to cross-sections taken along line A-A through line C-C in FIG. 1A. As illustrated in FIG. 11A through FIG. 11C, the insulating portion 34 is composed of an inorganic film 49 such as a silicon oxide film and a resin film 51 covering the inorganic film 49, and the inorganic film 49 is provided so as to contact and cover a part of the side surface of the cavity 32. In addition, the distances between the metal plate 28 and the series resonators 12, the parallel resonators 14, and the signal wirings 20 are, for example, about 1 μm. Other structures are the same as those of the ladder-type filter of the first embodiment illustrated in FIG. 1A through FIG. 2C, and thus a detail description is omitted.

A description will be given of a fabrication method of the ladder-type filter of the second embodiment with reference to FIG. 12A through FIG. 17C. First, on the piezoelectric substrate 10, formed are the series resonators 12, the parallel resonators 14, the signal wirings 20, the ground wirings 23, the electrical supply wirings 38, the underlayer electrodes 40, and the terminal electrodes 42 by performing the processes of FIG. 3A through FIG. 4C described in the fabrication method of the ladder-type filter of the first embodiment.

Figure 12A:
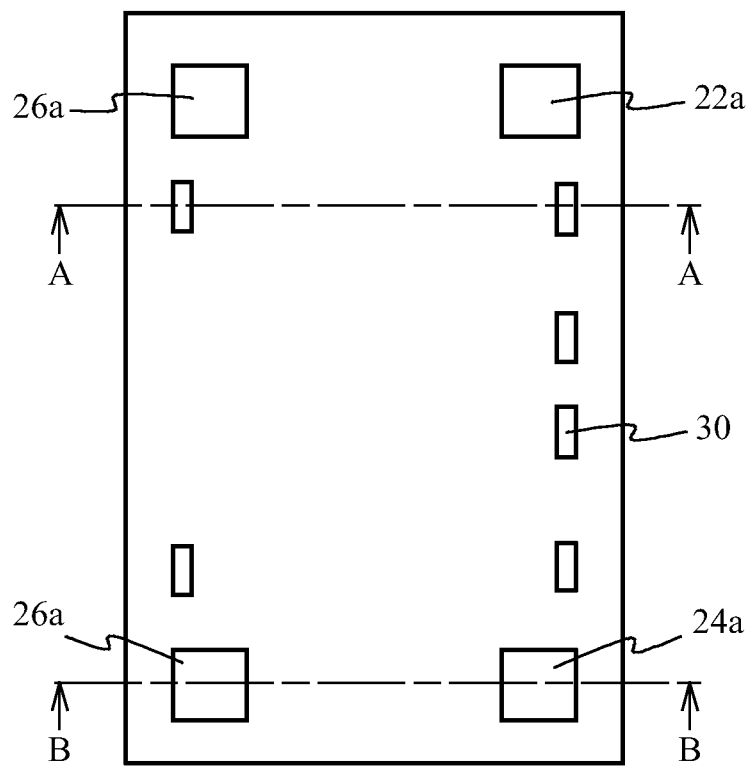
FIG. 12A is a top view (No. 1) illustrating a fabrication method of the ladder-type filter in accordance with the second embodiment.
Figure 12B:
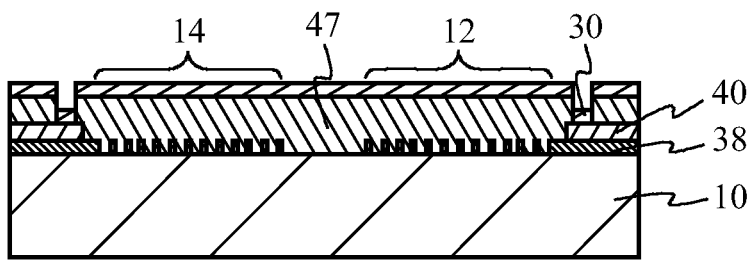
FIG. 12B is a cross-sectional view taken along line A-A in FIG. 12A.
Figure 12C:
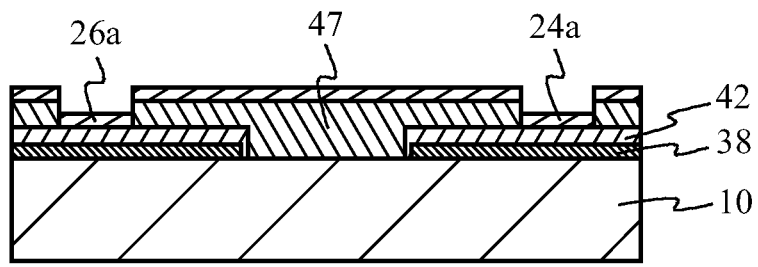
FIG. 12C is a cross-sectional view taken along line B-B in FIG. 12A.

As illustrated in FIG. 12A through FIG. 12C, a photoresist 47 is applied on the piezoelectric substrate 10 for example, and is patterned to form openings corresponding to the regions where the support posts 30, the input terminal 22, the output terminal 24, and the ground terminals 26 are to be formed. The photoresist 47 has a thickness of 3 to 6 μm for example. Then, a metal film such as a Cu film with a total film thickness of 1 μm is formed to be embedded in the openings of the photoresist 47 by evaporation for example. This process forms the support posts 30, and the input terminal 22a, the output terminal 24a, and the ground terminals 26a that are portions of the input terminal 22, the output terminal 24, and the ground terminals 26 respectively.

Figure 13A:
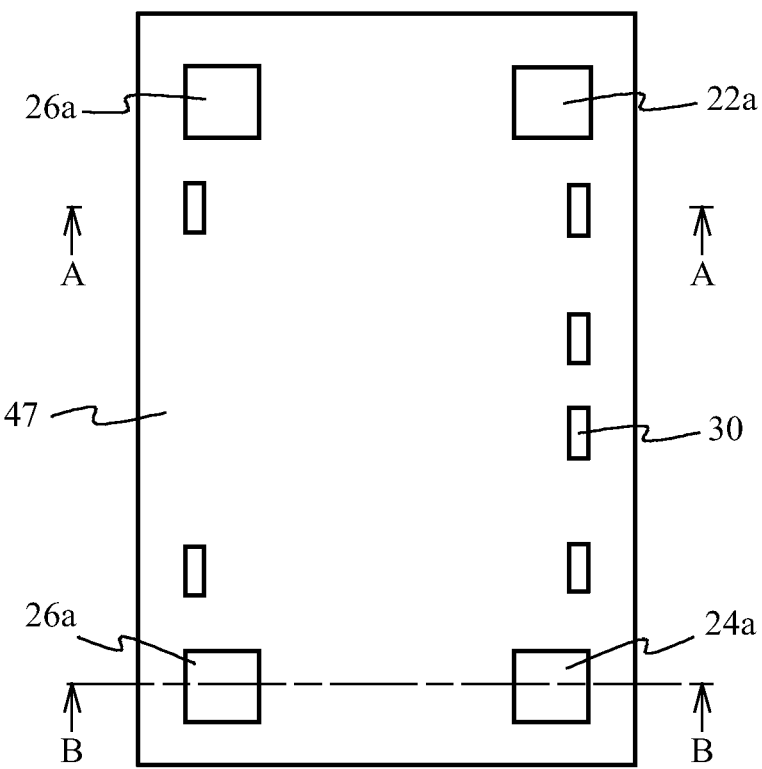
FIG. 13A is a top view (No. 2) illustrating the fabrication method of the ladder-type filter in accordance with the second embodiment.
Figure 13B:
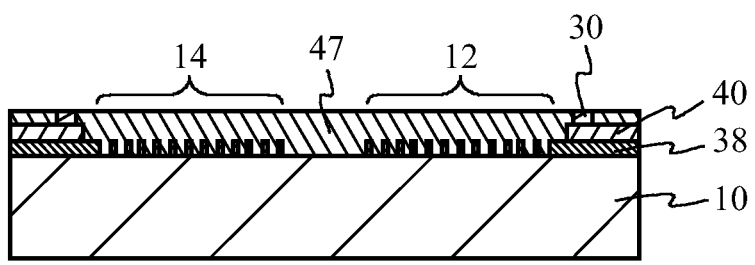
FIG. 13B is a cross-sectional view taken along line A-A in FIG. 13A.
Figure 13C:
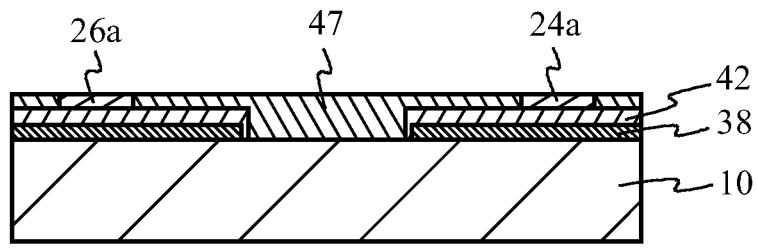
FIG. 13C is a cross-sectional view taken along line B-B in FIG. 13A.

As illustrated in FIG. 13A through FIG. 13C, the photoresist 47 is lifted off to remove unnecessary parts of the metal film. Next, the photoresist 47 is applied again with a thickness of about 1 μm. Surfaces of the support posts 30, the input terminal 22a, the output terminal 24a, and the ground terminals 26a are exposed by etch back or the like.

Figure 14A:
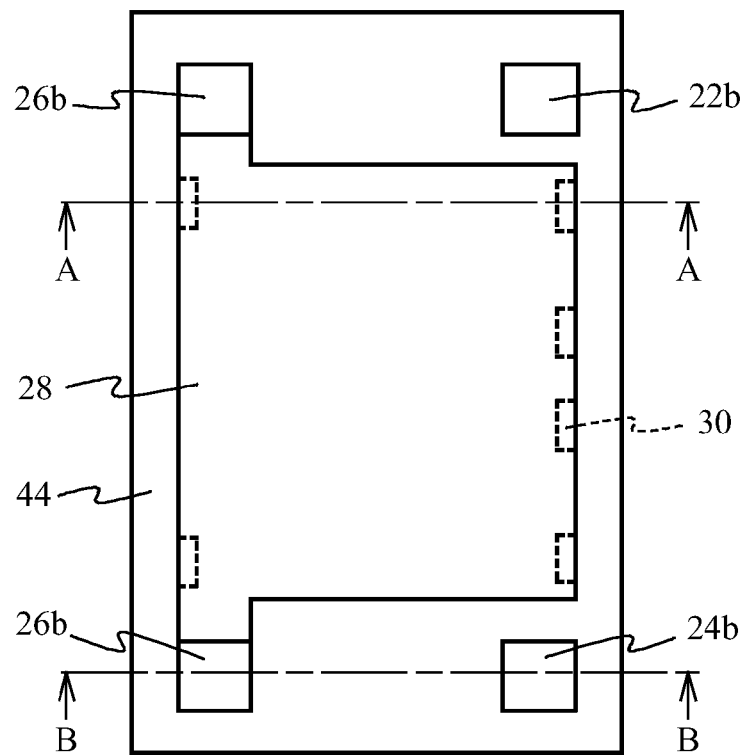
FIG. 14A is a top view (No. 3) illustrating the fabrication method of the ladder-type filter in accordance with the second embodiment.
Figure 14B:
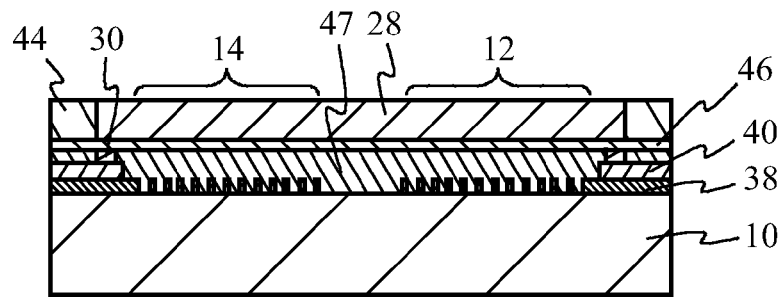
FIG. 14B is a cross-sectional view taken along line A-A in FIG. 14A.
Figure 14C:
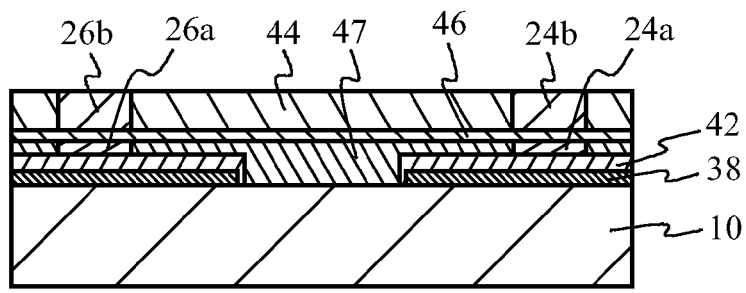
FIG. 14C is a cross-sectional view taken along line B-B in FIG. 14A.

As illustrated in FIG. 14A through FIG. 14C, the seed metal 46 for metal plating such as Cu plating is formed on the entire surface by evaporation or sputtering for example. Then, the plating resist 44 with a thickness of, for example, 5 to 30 μm is patterned to form openings corresponding to the regions where the metal plate 28, the input terminal 22, the output terminal 24, and the ground terminals 26 are to be formed. A metal film such as a Cu film is then formed so as to be embedded in the openings of the plating resist 44 by electrolytic plating for example to form the metal plate 28, and the input terminal 22b, the output terminal 24b, and the ground terminals 26b that are portions of the input terminal 22, the output terminal 24, and the ground terminals 26 respectively.

Figure 15A:
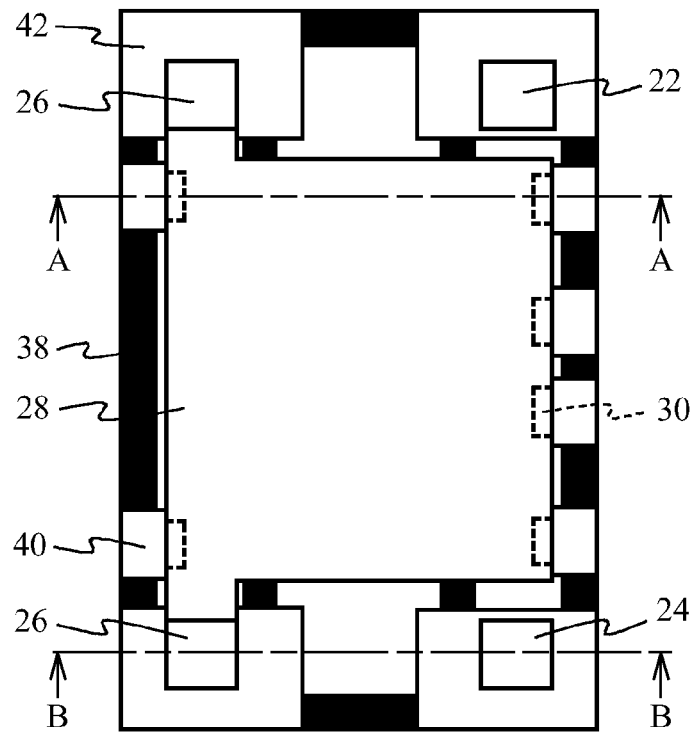
FIG. 15A is a top view (No. 4) illustrating the fabrication method of the ladder-type filter in accordance with the second embodiment.
Figure 15B:
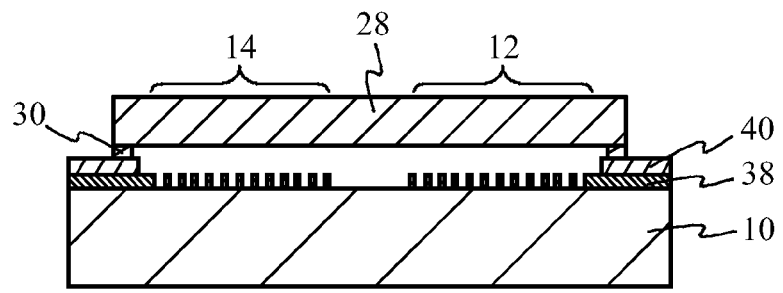
FIG. 15B is a cross-sectional view taken along line A-A in FIG. 15A.
Figure 15C:
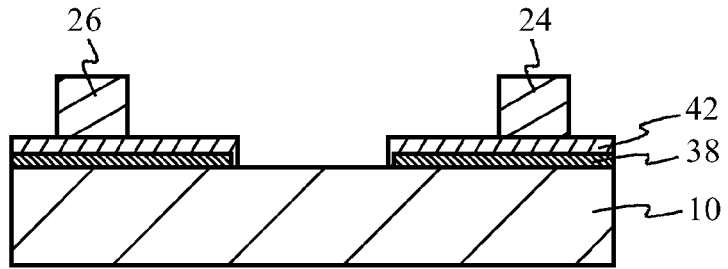
FIG. 15C is a cross-sectional view taken along line B-B in FIG. 15A.

As illustrated in FIG. 15A through FIG. 15C, the plating resist 44 and the photoresist 47 are removed by ultrasonic cleaning with a resist removing solution or the like for example. Since the metal plate 28 is supported by the support posts 30, the resist removing solution or the like penetrates between the piezoelectric substrate 10 and the metal plate 28, and removes the photoresist 47 between the piezoelectric substrate 10 and the metal plate 28. This process forms the cavity 32 on the electrode fingers of the comb-shaped electrodes of the series resonators 12 and the parallel resonators 14. In addition, the input terminal 22, the output terminal 24, and the ground terminals 26 are formed.

Figure 16A:
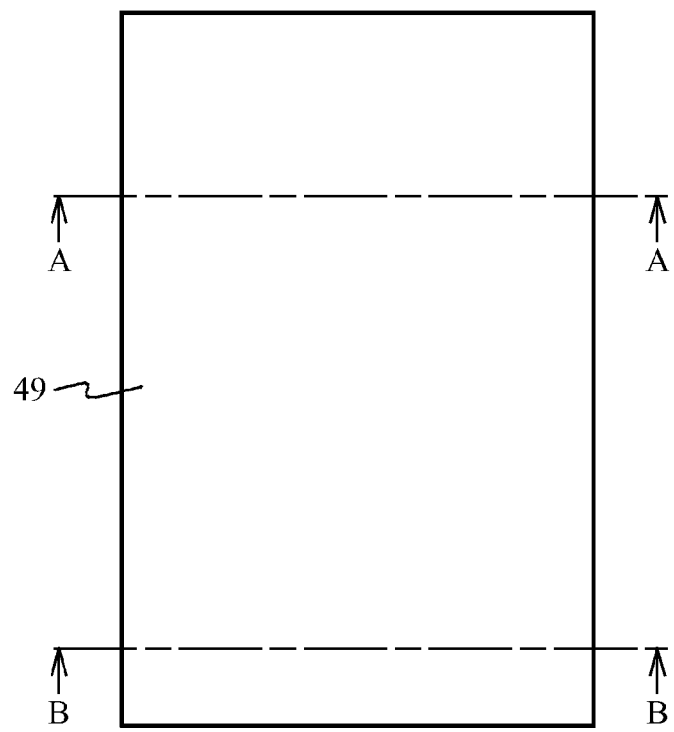
FIG. 16A is a top view (No. 5) illustrating the fabrication method of the ladder-type filter in accordance with the second embodiment.
Figure 16B:
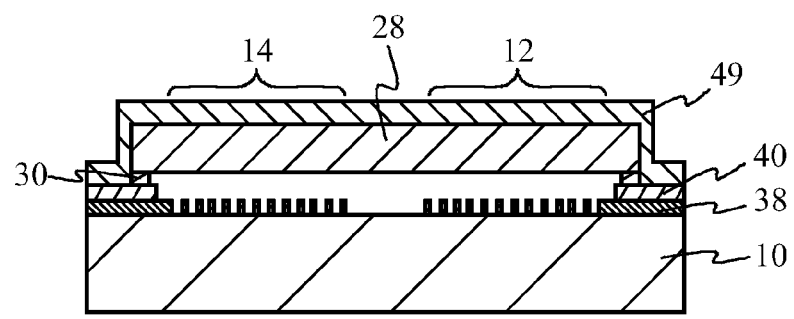
FIG. 16B is a cross-sectional view taken along line A-A in FIG. 16A.
Figure 16C:
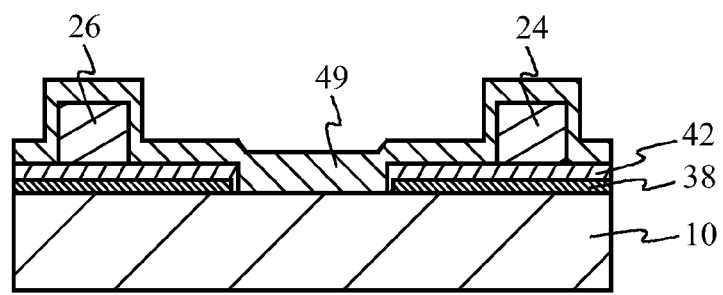
FIG. 16C is a cross-sectional view taken along line B-B in FIG. 16A.

As illustrated in FIG. 16A through FIG. 16C, the inorganic film 49 such as a silicon oxide film with a thickness of 2 to 3 μm is formed so as to cover the metal plate 28, the support posts 30, the input terminal 22, the output terminal 24, and the ground terminals 26 and contact the side surface of the cavity 32 by sputtering or SOG (spin coating on glass) for example. As the height of the support post 30 is low, 1 μm, the flow of the inorganic film 49 into the cavity 32 between the metal plate 28 and the series resonators 12 and parallel resonators 14 is suppressed not to contact the series resonators 12 and the parallel resonators 14, and the cavity 32 is secured.

Figure 17A:
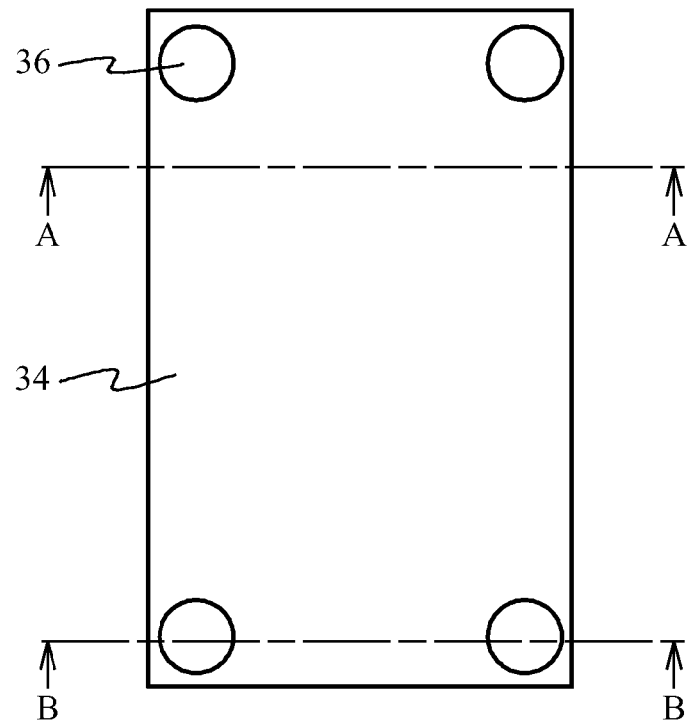
FIG. 17A is a top view (No. 6) illustrating the fabrication method of the ladder-type filter in accordance with the second embodiment.
Figure 17B:
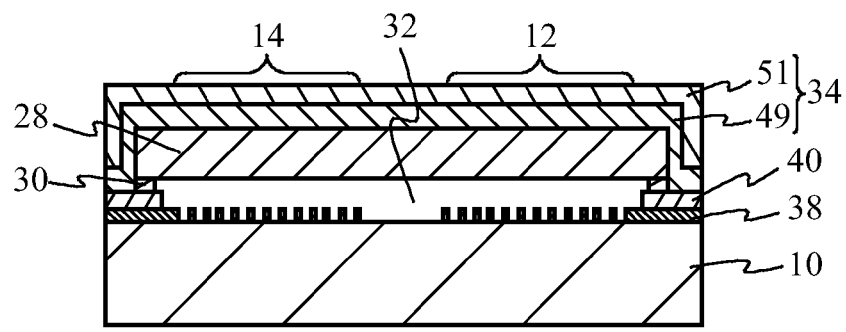
FIG. 17B is a cross-sectional view taken along line A-A in FIG. 17A.
Figure 17C:
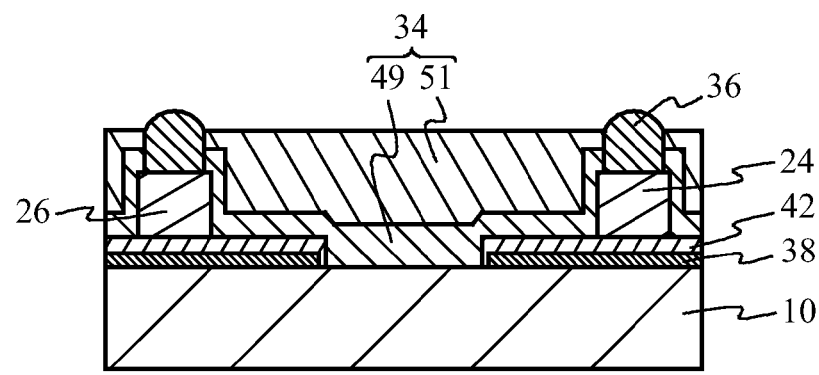
FIG. 17C is a cross-sectional view taken along line B-B in FIG. 17A.

As illustrated in FIG. 17A through FIG. 17C, the photosensitive resin film 51 is applied to make the surface flat. This process forms the insulating portion 34 composed of the inorganic film 49 and the resin film 51. The resin film 51 on the input terminal 22, the output terminal 24, and the ground terminals 26 is removed by exposure and development. Then, the inorganic film 49 on the input terminal 22, the output terminal 24, and the ground terminals 26 is removed by dry etching using a fluorine based gas such as $CF_4$. The solder balls 36 are then formed using the method previously described. The wafer is then separated into individual filters by dicing, and the ladder-type filter of the second embodiment is completed.

The second embodiment forms the inorganic film 49 such as a silicon oxide film so that the inorganic film 49 covers the metal plate 28, the support posts 30, and the like as illustrated in FIG. 16A through FIG. 16C. That is to say, the insulating portion 34 includes the inorganic film 49 such as a silicon oxide film, and is composed of the inorganic film 49 and the resin film 51. The inorganic film 49 is formed so as to contact and cover the side surface of the cavity 32. The inorganic film 49 formed so as to contact and cover the side surface of the cavity 32 can seal the cavity 32 more hermetically, and accordingly, the reliability of the resonator can be further improved. As described above, the insulating portion 34 may include an insulating material other than a resin, or may be formed of only an insulating material other than a resin.

In addition, the height of the support post 30 is preferably lower than or equal to a height capable of preventing the inorganic film 49 flowing into the cavity from contacting the resonators formed in the cavity 32 when the inorganic film 49 is formed. For example, the height of the support post 30 (the height of the cavity 32) is preferably less than or equal to 15 times, and more preferably less than or equal to 10 times greater than the film thickness of the electrode finger.

Third Embodiment

Figure 18:
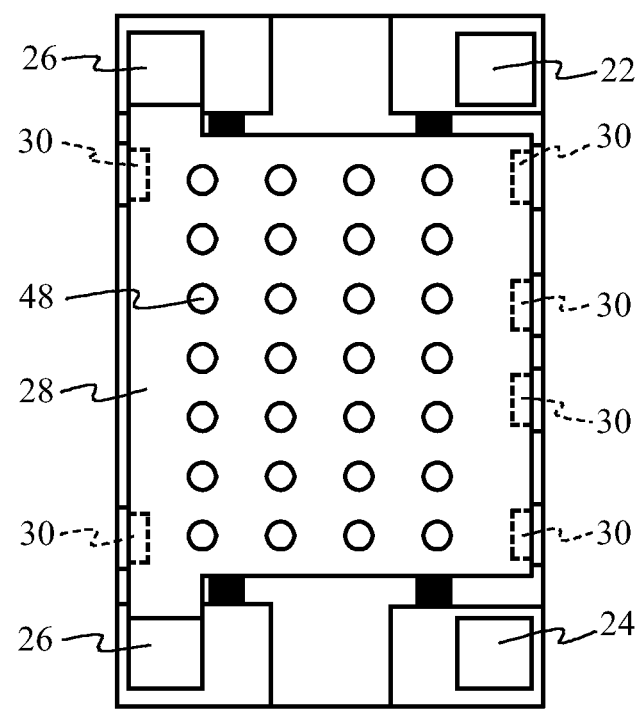
FIG. 18 is a top view of a ladder-type filter in accordance with a third embodiment.

FIG. 18 is a top view of a ladder-type filter in accordance with a third embodiment, and illustrates an insulating portion transparently. As illustrated in FIG. 18, penetration holes 48 are formed in the metal plate 28. Other structures are the same as those of the ladder-type filter in accordance with the first embodiment, and thus a detail description is omitted.

The metal plate 28 with the penetration holes 48 formed therein is formed by leaving the plating resist 44 at positions where the penetration holes 48 are to be formed, and performing Cu plating in the fabrication processes illustrated in FIG. 6A through FIG. 6C.

As described above, the third embodiment forms the penetration holes 48 in the metal plate 28. For the removal of the plating resist 44 illustrated in FIG. 7A and FIG. 7C, this enables to remove the plating resist 44 formed between the piezoelectric substrate 10 and the metal plate 28 easily. In addition, the metal plate 28 with a too high strength causes a stress concentration between the metal plate 28 and the support posts 30 supporting the metal plate 28, and may cause separation of the metal plate 28. The penetration holes 48 formed in the metal plate 28 lower the strength of the metal plate 28, and thus can prevent the separation of the metal plate 28.

Multiple penetration holes 48 are preferably formed in order to make the removal of the plating resist 44 easy and to prevent the separation of the metal plate 28. The penetration holes 48 may be arranged regularly or randomly, but are preferably arranged regularly in order to make the removal of the plating resist 44 easy and to suppress the stress concentration between the metal plate 28 and the support posts 30. In addition, as the insulating portion 34 is formed so as to cover the metal plate 28, the penetration holes 48 formed in the metal plate 28 preferably have sizes that can prevent flow of the resin thereinto. For example, diameters of the penetration holes 48 are preferably approximately equal to or smaller than the height of the support post 30.

Fourth Embodiment

Figure 19:
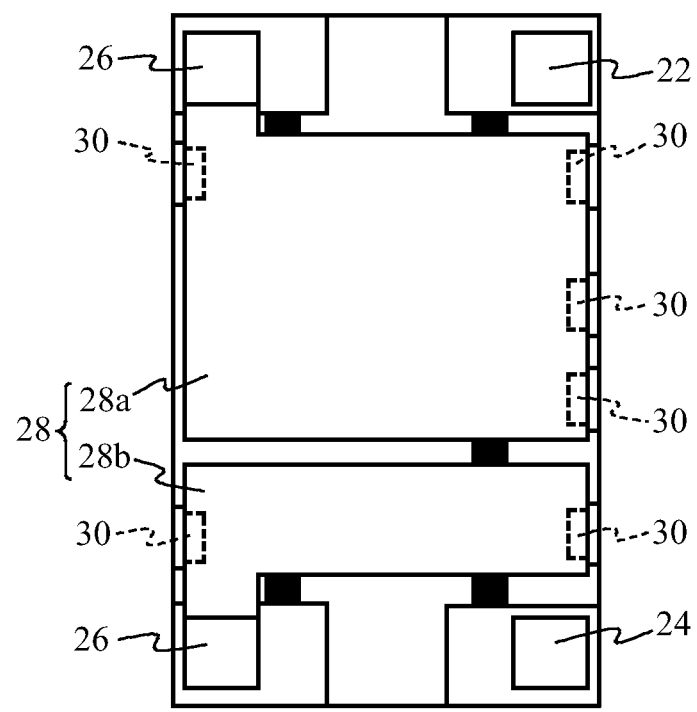
FIG. 19 is a top view of a ladder-type filter in accordance with a fourth embodiment.

FIG. 19 is a top view of a ladder-type filter in accordance with a fourth embodiment, and illustrates an insulating portion transparently. As illustrated in FIG. 19, the metal plate 28 are composed of separated plates 28a and 28b that are separated and made of a metal. That is to say, the separated plates 28a and 28b are physically and electrically separated. Other structures are the same as those of the ladder-type filter in accordance with the first embodiment, and a detail description is omitted.

The metal plate 28 separated into the separated plates 28a and 28b is formed by leaving the plating resist 44 in parts to be separated and performing Cu plating in the fabrication processes illustrated in FIG. 6A through FIG. 6C.

As described above, the fourth embodiment forms the metal plate 28 composed of two separated plates 28a and 28b that are separated. The ground terminal 26 has an inductance component, and thus is sometimes used to improve suppression components of filter characteristics in filter design. Thus, the inductance component of the ground terminal 26 is adjusted. Therefore, the inductance components of the ground terminals 26 can be separated by separating the metal plate 28 electrically connected to the ground terminals 26 into two separated plates 28a and 28b, and this makes the adjustment of the filter characteristics easy.

The fourth embodiment separates the metal plate 28 into two separated plates 28a and 28b, but the metal plate 28 may be separated into three, four, or other numbers of separated plates in accordance with the number of the ground terminals.

Fifth Embodiment

Figure 20:
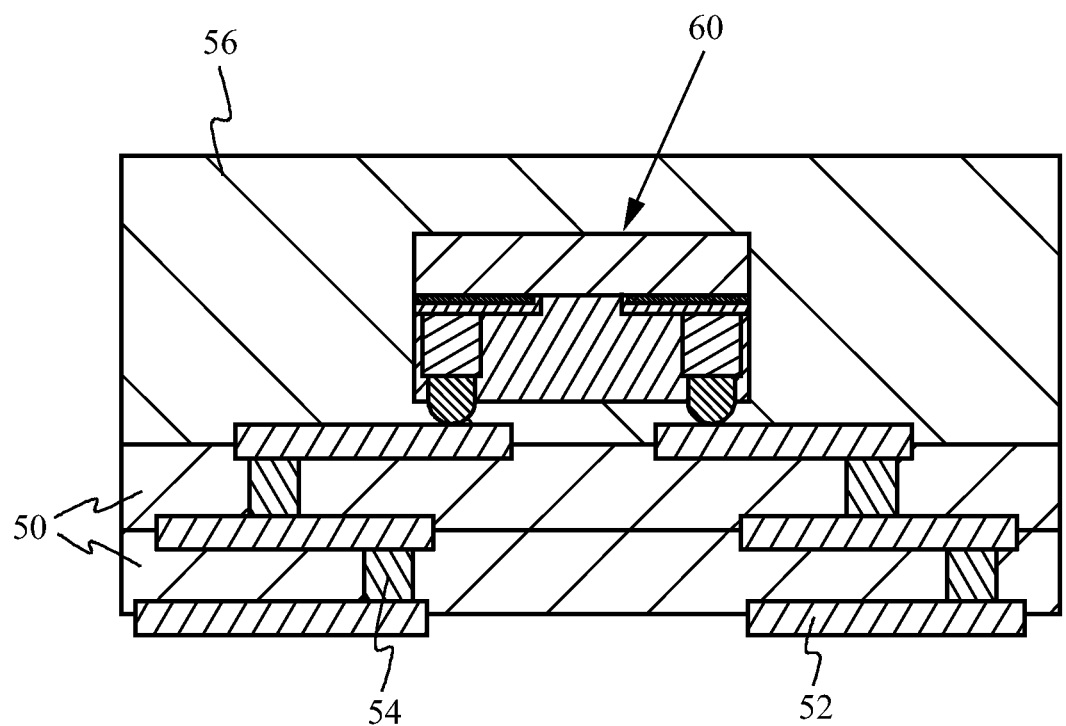
FIG. 20 is a cross-sectional view of an acoustic wave device in accordance with a fifth embodiment.

A fifth embodiment is an exemplary acoustic wave device having the ladder-type filter in accordance with any one of the first through fourth embodiments. FIG. 20 is a cross-sectional view of an acoustic wave device in accordance with the fifth embodiment. As illustrated in FIG. 20, printed circuit boards 50 made of, for example, a resin are stacked. Wirings 52 are formed in each layer of the stacked printed circuit boards 50. The wirings 52 are metals such as Au (gold)-plated Cu wirings for example. The wirings 52 formed in the layers of the printed circuit boards 50 are interconnected through vias 54. A ladder-type filter 60 is flip-chip mounted on the wirings 52 formed on the printed circuit board 50 located uppermost. A mold resin 56 covering the ladder-type filter 60 is located on the printed circuit board 50 located uppermost.

The fifth embodiment flip-chip mounts the ladder-type filter of any one of the first through fourth embodiments on the printed circuit board 50, and thus enables to obtain an acoustic wave device capable of suppressing degradation of characteristics and reducing height.

Sixth Embodiment

Figure 21:
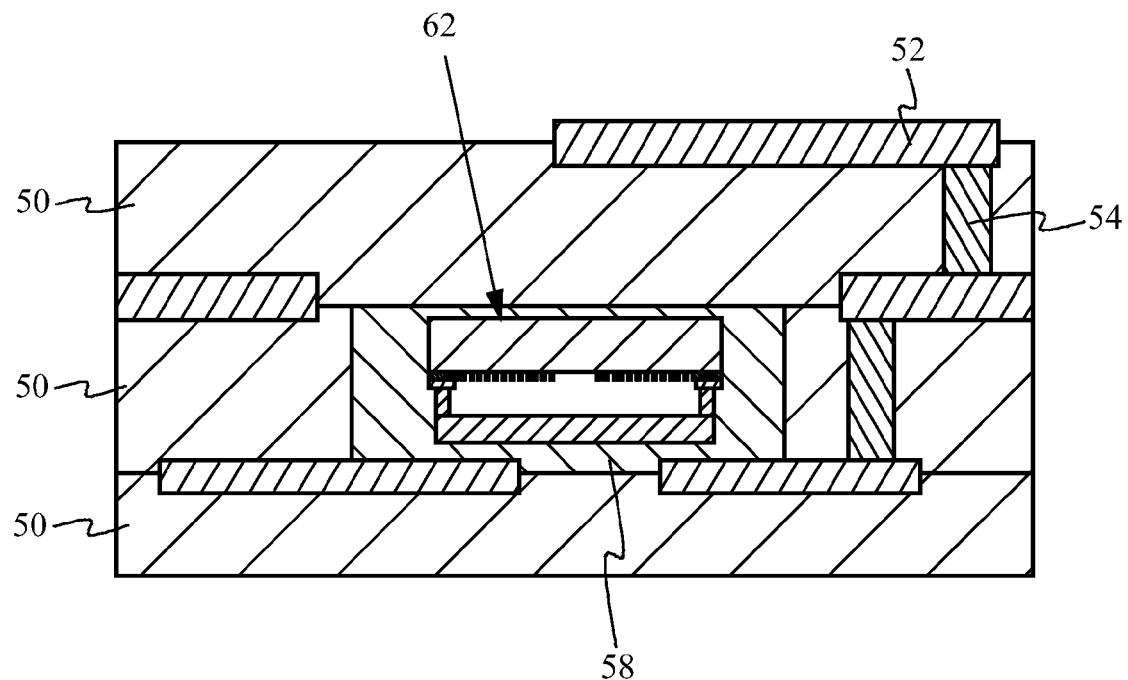
FIG. 21 is a cross-sectional view of an acoustic wave device in accordance with a sixth embodiment.

A sixth embodiment is an exemplary acoustic wave device having a ladder-type filter embedded in a printed circuit board. The ladder-type filter may have a structure same as that of the ladder-type filter in accordance with any one of the first through fourth embodiments except that the insulating portion 34 is removed. FIG. 21 is a cross-sectional view of an acoustic wave device in accordance with the sixth embodiment. As illustrated in FIG. 21, the printed circuit boards 50 made of, for example, a resin are stacked. The wirings 52 are formed in each layer of the stacked printed circuit boards 50. The wiring 52 formed in the layers of the printed circuit boards 50 are interconnected through the vias 54. A ladder-type filter 62 is provided so as to be embedded in the stacked printed circuit boards 50. The ladder-type filter 62 is flip-chip mounted on the wirings 52. An insulating portion 58 made of a resin film is provided so as to cover the whole of the ladder-type filter 62. The insulating portion 58 seals and fixes the ladder-type filter 62.

The sixth embodiment embeds the ladder-type filter 62 in the printed circuit boards 50, and provides the insulating portion 58 covering the whole of the ladder-type filter 62. That is to say, the insulating portion 58 covers the metal plate 28 and the support posts 30. When a viscosity of the resin used for the insulating portion 58 is high to the extent that the resin does not flow into the cavity 32 between the series resonators 12 and parallel resonators 14 and the metal plate 28, the cavity 32 can be secured, and the insulating portion 58 contacts the side surface of the cavity 32.

The sixth embodiment also enables to obtain an acoustic wave device capable of suppressing degradation of characteristics, and reducing height.

Although the embodiments of the present invention have been described in detail, it should be understood that the various change, substitutions, and alterations could be made hereto without departing from the spirit and scope of the invention.

What is claimed is:

1. An electronic component, comprising:
   an element that is located on a substrate;
   a signal wiring that is located on the substrate and electrically connected to the element;
   a metal plate that is located so as to form a cavity on a functional part of the element and that covers an upper surface of the cavity;
   a support post that is located on the substrate without being located on the signal wiring, and that supports the metal plate; and
   an insulating portion that covers the metal plate and the support post, and that contacts a side surface of the cavity.

2. The electronic component according to claim 1, wherein the support post is made of a metal.

3. The electronic component according to claim 1, wherein the support posts are located along opposing sides of the metal plate so as to have lengths shorter than lengths of the sides.

4. The electronic component according to claim 1, further comprising:
a connection terminal that is located on the substrate so as to penetrate through the insulating portion, and provides an external electrical connection to the element, wherein
a height from the substrate to an upper surface of the connection terminal is equal to a height from the substrate to an upper surface of the metal plate.

5. The electronic component according to claim 4, wherein the metal plate electrically connects to the connection terminal connected to a ground.

6. The electronic component according to claim 5, wherein the metal plate extends to the connection terminal connected to the ground and contacts the connection terminal connected to the ground to electrically connect to the connection terminal connected to the ground.

7. The electronic component according to claim 1, wherein the insulating portion has a resin film contacting the side surface of the cavity.

8. The electronic component according to claim 1, wherein the insulating portion has an inorganic film contacting the side surface of the cavity.

9. The electronic component according to claim 1, wherein a penetration hole is formed in the metal plate.

10. The electronic component according to claim 1, wherein
the metal plate is composed of separated plates that are separated.

11. The electronic component according to claim 1, wherein
the substrate is a piezoelectric substrate, and
the element is an acoustic wave element.

12. The electronic component according to claim 11, wherein
the acoustic wave element is a surface acoustic wave element, and
a height of the support post is more than or equal to 5 times greater than a thickness of an electrode finger of the surface acoustic wave element.

13. An electronic device comprising:
a printed circuit board having the electronic component according to claim 1 mounted thereon.

14. The electronic device according to claim 13, wherein
the electronic component is embedded in the printed circuit board, and
the insulating portion is provided so as to cover the whole of the electronic component.

15. A fabrication method of an electronic component comprising:
forming an element on a substrate;
forming a signal wiring, which electrically connects to the element, on the substrate;
forming a support post on the substrate, the support post being not located on the signal wiring;
forming a metal plate on the support post so that the metal plate forms a cavity on a functional part of the element and covers an upper surface of the cavity; and
forming an insulating portion that covers the metal plate and the support post and that contacts a side surface of the cavity so as to secure the cavity after the forming the support post and the forming the metal plate.

16. The fabrication method according to claim 15, wherein
the forming the support post forms the support posts, which have lengths shorter than lengths of opposing sides of the metal plate, along the opposing sides.

17. The fabrication method according to claim 15, wherein
the forming the insulating portion includes a step of bonding a resin sheet to the substrate so that the resin sheet covers the metal plate and the support post and contacts the side surface of the cavity.

18. The fabrication method according to claim 15, wherein
the forming the insulating portion includes a step of forming an inorganic film so that the inorganic film covers the metal plate and the support post and contacts the side surface of the cavity.

19. The fabrication method according to claim 15, further comprising:
forming a connection terminal, which provides an external electrical connection to the element, on the substrate, wherein
the forming the support post, the forming the metal plate, and the forming the connection terminal are performed simultaneously.

* * * * *